US009786251B1

(12) United States Patent
Gordin et al.

(10) Patent No.: US 9,786,251 B1
(45) Date of Patent: Oct. 10, 2017

(54) APPARATUS, METHOD, AND SYSTEM FOR VISUALLY INDICATING PERCEIVED GLARE THRESHOLDS

(71) Applicant: Musco Corporation, Oskaloosa, IA (US)

(72) Inventors: Myron Gordin, Oskaloosa, IA (US); Lance K. Livingston, Arvada, CO (US); Kevin J. Marshall, Golden, CO (US)

(73) Assignee: Musco Corporation, Oskaloosa, IA (US)

( * ) Notice: Subject to any disclaimer, the term of this patent is extended or adjusted under 35 U.S.C. 154(b) by 78 days.

(21) Appl. No.: 14/724,451

(22) Filed: May 28, 2015

Related U.S. Application Data

(60) Provisional application No. 62/003,854, filed on May 28, 2014.

(51) Int. Cl.
*G06K 9/40* (2006.01)
*G09G 5/02* (2006.01)
(Continued)

(52) U.S. Cl.
CPC ............. *G09G 5/02* (2013.01); *G09G 3/3406* (2013.01); *H04N 5/57* (2013.01); *G06K 9/40* (2013.01);
(Continued)

(58) Field of Classification Search
CPC ...... G06F 3/013; G06F 3/012; G06F 7/70633; G06F 3/0304; G06F 17/30244;
(Continued)

(56) References Cited

U.S. PATENT DOCUMENTS 5,204,778 A * 4/1993 Bechtel ................... B60R 1/088
250/206
5,211,473 A 5/1993 Gordin et al.
(Continued)

OTHER PUBLICATIONS

Breeze Systems, website, 6 pages, website accessed on May 25, 2014.
(Continued)

*Primary Examiner* — Vu Le
*Assistant Examiner* — Aklilu Woldemariam
(74) *Attorney, Agent, or Firm* — McKee, Voorhees & Sease, PLC

(57) ABSTRACT

Discussed herein is the adequate lighting of a target area as viewed from one or more vantage points to one or more specifications for one or more situations, and in a manner that addresses glare; in particular, glare perception. Various apparatuses, methods, and systems are presented herein whereby glare thresholds are visually indicated. Said glare-indicating apparatus, methods, and/or systems are readily implemented using existing lighting design tools, adaptable in accordance with advances in glare science, and either avoid or overcome limitations of existing glare models. Said apparatuses, methods, and systems can be adapted for real-time evaluation of glare so to, for example, aid a lighting designer in vetting generated (i.e., virtual) lighting designs and identify retrofit options for existing lighting systems.

22 Claims, 33 Drawing Sheets
(30 of 33 Drawing Sheet(s) Filed in Color)

(51) Int. Cl.
*H04N 5/57* (2006.01)
*G09G 3/34* (2006.01)

(52) U.S. Cl.
CPC ............ *G09G 2320/0233* (2013.01); *G09G 2320/0606* (2013.01); *G09G 2320/0626* (2013.01); *G09G 2320/0666* (2013.01)

(58) Field of Classification Search
CPC .... G02B 2027/0123; G02B 2027/0134; G02B 2027/015; G02B 2027/0185; G06T 19/20; G06T 15/50; G06T 2215/16; G06T 5/40; G06T 2207/20016; G06T 5/007; G06T 2207/20192; G06T 5/003; G06T 5/20; G09G 3/2003; H04N 13/0484; H04N 2201/0089; H04N 5/23219; H04N 1/2133; H04N 1/00127; H04N 2201/0084; H04N 5/57; H04N 11/002; H04N 1/6058; H04N 9/8205; H04N 19/172; H04N 19/176; H04N 19/30; H04N 19/85; G06K 9/00597; G06K 2209/23; G06K 9/00577; G06K 9/00664; G06K 9/00825; G06K 9/00986; H05B 33/0845; H05B 37/02; A61B 3/113; B60Q 2300/312; B60Q 2300/314; F21K 9/23; F21S 48/1747; F21S 8/088; F21V 23/0471; F21V 14/04; F21V 14/08; F21V 29/73; F21V 29/763; F21V 7/0025; F21W 2131/40; F21W 2131/103; F21W 2131/10; F21Y 2101/00; F21Y 2113/00; F21Y 2115/10; F21Y 2103/10; F21Y 2105/00; G03F 7/70633; B60N 2002/0272; G01B 11/14; G01S 17/88; G01S 7/48; G01S 7/539; H04M 1/02
USPC .............. 382/254; 356/138, 445, 614, 620; 362/231, 276, 227, 234, 230

See application file for complete search history.

(56) References Cited

U.S. PATENT DOCUMENTS

| | | | |
|---|---|---|---|
| 5,799,111 A * | 8/1998 | Guissin | H04N 19/86 358/447 |
| 5,803,579 A * | 9/1998 | Turnbull | B60L 1/14 257/E25.02 |
| 6,550,949 B1 * | 4/2003 | Bauer | B60Q 1/0023 257/118 |
| 6,705,744 B2 | 3/2004 | Hubbell et al. | |
| 7,289,213 B2 * | 10/2007 | Mieher | G01N 21/956 257/797 |
| 7,480,035 B2 | 1/2009 | Overbeck et al. | |
| 7,998,326 B2 | 8/2011 | Sakuraoka et al. | |
| 8,100,552 B2 | 1/2012 | Spero | |
| 8,253,752 B2 * | 8/2012 | Raveendran | G06T 5/007 345/472 |
| 8,345,144 B1 * | 1/2013 | Georgiev | G03B 11/00 348/335 |
| 8,427,426 B2 * | 4/2013 | Corson | G06F 3/0325 345/157 |
| 8,928,662 B2 | 1/2015 | Gordin et al. | |
| 9,530,382 B2 * | 12/2016 | Simmons | G02B 27/225 |
| 2006/0182361 A1 * | 8/2006 | Ptucha | G06T 5/009 382/254 |
| 2007/0177160 A1 * | 8/2007 | Sasaki | G06T 7/50 356/603 |
| 2010/0106674 A1 * | 4/2010 | McLean | G06Q 10/06 706/52 |
| 2011/0235855 A1 * | 9/2011 | Smith | G06F 3/0304 382/103 |
| 2012/0050254 A1 * | 3/2012 | Gordin | G06T 15/50 345/418 |
| 2012/0051635 A1 * | 3/2012 | Kunkel | G06T 5/009 382/165 |
| 2013/0050426 A1 * | 2/2013 | Sarmast | G01S 17/89 348/46 |
| 2013/0250556 A1 * | 9/2013 | Gordin | F21S 8/088 362/147 |
| 2013/0287313 A1 * | 10/2013 | Marchessoux | G09G 5/10 382/274 |
| 2013/0300911 A1 * | 11/2013 | Beckman | G02B 27/0101 348/335 |
| 2014/0067733 A1 * | 3/2014 | Humann | G05B 13/02 706/12 |
| 2014/0210847 A1 * | 7/2014 | Knibbeler | G09G 5/006 345/589 |
| 2015/0358646 A1 * | 12/2015 | Mertens | H04N 1/6058 382/166 |
| 2015/0373806 A1 * | 12/2015 | Vissenberg | H05B 33/0872 315/151 |
| 2016/0093029 A1 * | 3/2016 | Micovic | H04N 5/2355 348/229.1 |

OTHER PUBLICATIONS

Canon USA : Canon Digital Camera Software Developer's Kit, 4 pages, website accessed on May 25, 2014.
Clear, RD, "Discomfort glare: What do we actually know?" Lighting Res. Technol.; 0:1-18, Apr. 19, 2012.
Flannagan, Michael J., "Subjective and Objective Aspects of Headlamp Glare: Effects of Size and Spectral Power Distribution" UMTRI-99-36, 19 pages, Nov. 1999.
itftennis.com—Technical, 7 pages, website accessed on May 7, 2014.
Krawczyk, Grzegorz Marek, "Perception-Inspired Tone Mapping" Dissertation, 145 pages, dated Oct. 9, 2007.
Krawczyk, Grzegorz et al., "Photometric Calibration of High Dynamic Range Cameras", MPI Informatik, 21 pages, May 4, 2005.
Larson, Gregory Ward et al., "A Visibility Matching Tone Reproduction Operator for High Dynamic Range Scenes" IEEE Transactions on Visualization & Computer Graphics, vol. 3, No. 4, Oct.-Dec. 1997, pp. 291-306.
Lighting Analysts, Inc., "What is AGi32?" AGi 32 version 14, 8 pages, copyright 2013.
Mrovlje, Jernej et al., "Distance measuring based on stereoscopic pictures" 9th Intl. PhD Workshop on Systems & Control: Young Generation Viewpoint, Oct. 1-3, 2008, 6 pages.
NHTSA, "Assessment of Headlamp Glare and Potential Counter Meausres: The Effects of Headlamp Mounting Height", DOT HS 810 947, 45 pages, Jun. 2008.
Reinhard, Erik, et al. "Dynamic Range Reduction inspiered by Photoreceptor Physiology", IEEE Transactions on Visualization and Computer Graphics, vol. 11, Issue 1, 12 pages, Jan.-Feb. 2005.
Robertson, Mark A. et al., "Estimation-theoretic approach to dynamic range enhancement using multiple exposures" Journal of Electronic Imaging 12(2), 219-228, Apr. 2003.
Schieber, Frank, "Analytic Study of Daytime Running Lights as Potential Sources of Disability and Discomfort Glare under Ambient Illumination Conditions Ranging from Dawn through Dusk" 25 pages, Oct. 26, 1998.
US Dept of Transportation, Laboratory Test Procedure for FMVSS 108, TP-108-13, 731 pages, Dec. 4, 2007.
Ward, Greg, "59.2 Defining Dynamic Range", Proceedings of the 2008 Society of Information Display International Symposium, Digest of Technical Papers, 3 pages, May 2008.
Wienold, Jan et al. "Evalglare—A new RADIANCE-based tool to evaluate daylight glare in office spaces", Published in 3rd Int'l Radiance Workshop 2004, 2 pages.
Doyle, Shelby et al., "High Dynamic Range Imaging & Glare Analysis", Harvard University, 58 pages, Jul. 15, 2010.
Hiscocks, Peter D., "Measuring Luminance with a Digital Camera", 27 pages, Syscomp Electronic Design Limited, Feb. 16, 2014.

(56) References Cited

OTHER PUBLICATIONS

Ward, Greg et al., "JPEG-HDR: A Backwards-Compatible, High Dynamic Range Extension of JPEG", 8 pages, BrightSide Technologies, Jul. 30, 2006.

* cited by examiner

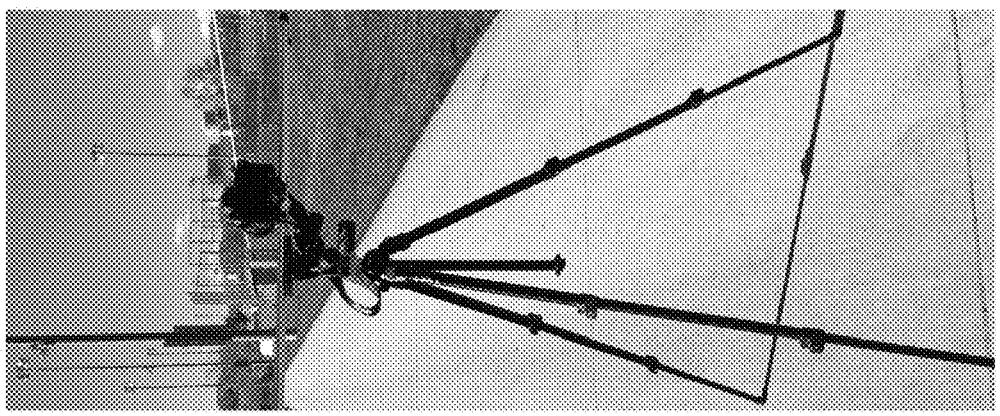
Figure 25

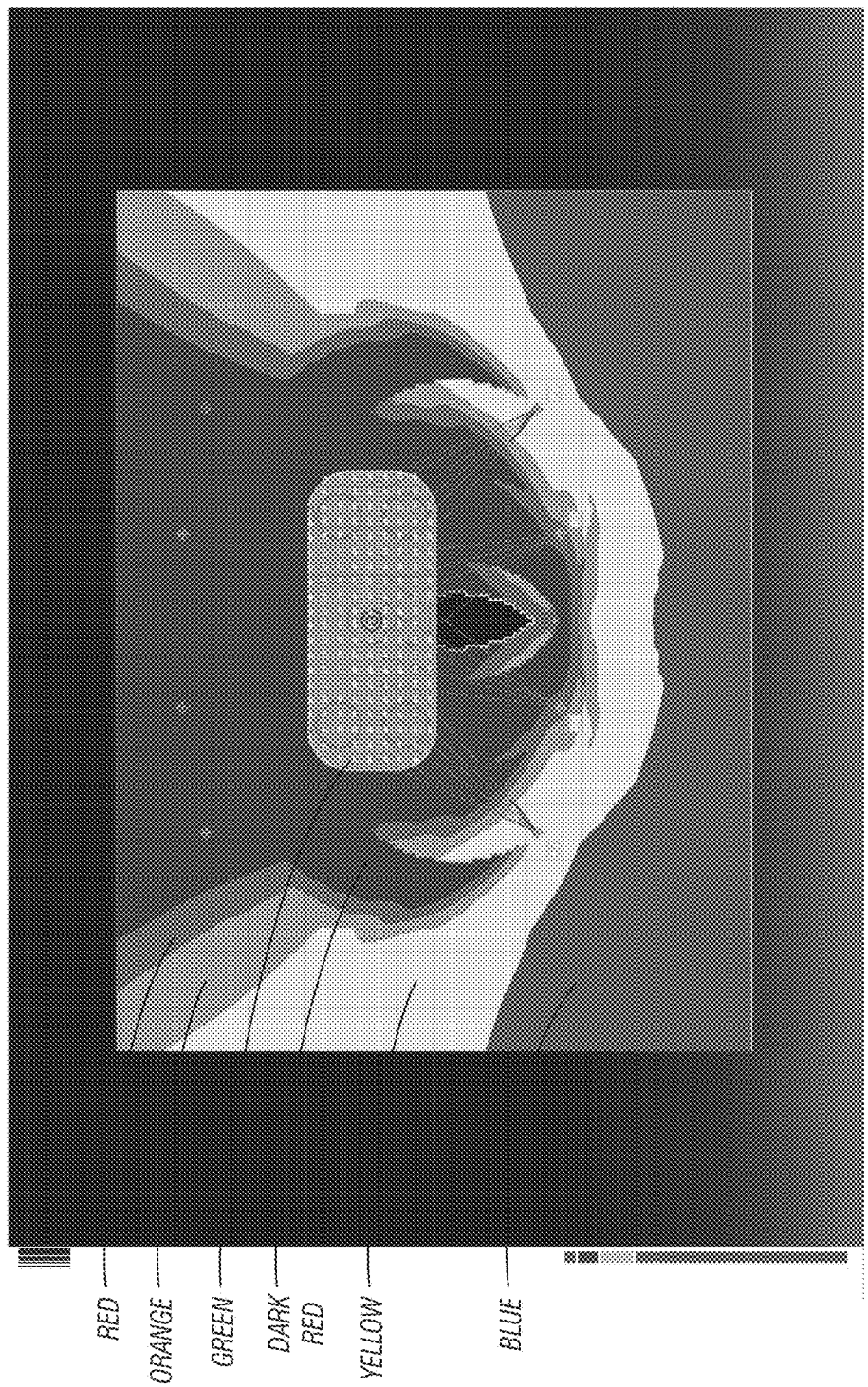

APPARATUS, METHOD, AND SYSTEM FOR VISUALLY INDICATING PERCEIVED GLARE THRESHOLDS

CROSS-REFERENCE TO RELATED APPLICATIONS

This application claims benefit under 35 U.S.C. §119 to provisional U.S. application Ser. No. 62/003,854, filed May 28, 2014, hereby incorporated by reference in its entirety.

I. COPYRIGHT NOTICE

The Specification and associated Figures of this application are subject to copyright protection. The copyright owner has no objection to authorized facsimile reproduction of this patent disclosure as it appears in the U.S. Patent and Trademark Office files or records, but otherwise reserves all rights to copyright and use of material herein. Copyright 2014, 2015 Musco Sports Lighting, LLC.

II. BACKGROUND OF THE INVENTION

The present invention generally relates to glare, and the subjective nature of glare perception. More specifically, the present invention relates to apparatuses, methods, and systems for quantifying what is primarily a subjective experience (i.e., glare perception), and in a manner that is useful for lighting design.

It is generally understood that any source that provides light may produce glare. It is also generally understood that while the process of seeing is fairly objective and affected by a number of known factors, the perceiving of glare remains a fairly subjective experience affected by some number of both known and unknown factors. While significant efforts have been spent in the lighting industry to measure glare (see, e.g., discussion of various glare models in Clear, RD. *Discomfort glare: What do we actually know?* Lighting Research & Technology 2012; 0: 1-18, incorporated by reference herein), and significant efforts have been spent designing lighting systems to minimize glare (see, for example, U.S. Pat. Nos. 5,211,473 and 7,988,326, and published patent application US2013/0250556 A1 (U.S. patent application Ser. No. 13/897,979) the lattermost incorporated by reference herein), there has been little agreement to date as to when glare poses an actual problem and which model for characterizing glare is appropriate for which situations—as it is generally understood that no single model for characterizing glare is appropriate for all situations (see again the aforementioned paper). So while it is understood that "glare science"—as it will be called herein—is ever advancing, practical applications of glare science have yet to be realized. That being said, a number of industries would benefit from an enhanced understanding of the human experience as it relates to glare; in particular, the lighting design industry.

A number of lighting design tools are well known in the industry: there exist tools to characterize a light source—or luminaire in terms of candela (see, e.g., any of the model AMS goniophotometers commercially available from Instrument Systems GmbH, Berlin, Germany); there exist tools to calculate vertical and horizontal footcandles based on the aforementioned candela data so to validate generated (i.e., virtual) lighting designs (see, e.g., AGi32 software commercially available from Lighting Analysts, Littleton, Colo., USA); there even exist tools to create photorealistic renderings of lighting designs overlaid on photographs of unlit sites (see, e.g., U.S. Pat. No. 8,928,662 the entirety of which is incorporated by reference herein), and tools to predict light levels in a virtual space prior to its construction (see, e.g., the Radiance Synthetic Imaging System available for download at http://radsite.lbl.gov/radiance/HOME.html homepage (website accessed 2015 May 1)). Each of the aforementioned tools serves a purpose and plays a role in achieving an ultimate goal: adequately lighting a target area (i.e., application area) as viewed from one or more vantage points to one or more specifications for one or more situations.

Since it has been stated that any source that produces light has the potential to produce glare, and any lighting design includes at least one light source, and a viewer at a number of vantage points could perceive glare from said source, it is readily apparent that the art of lighting design would benefit from somehow integrating glare analysis into existing lighting design tools. Yet while glare science has demonstrated the need for considering glare in lighting design, there exist only limited tools with which to do so. For example, some manufacturers of the aforementioned lighting design software do permit calculation of glare; to date, a Glare Rating (GR) as defined by the International Commission on Illumination (see, e.g., CIE 112-1994) or even a Unified Glare Rating (UGR) as defined by CIE 117-1995. However, as has been stated, no one glare model (GR, UGR, or otherwise) is appropriate for all situations, and no one glare model adequately addresses both discomfort and disability glare under most situations. Further, state-of-the-art glare calculation in lighting design software is limited to reporting numbers on a grid; adequate for demonstrating adherence to any governing codes or standards, but providing very little context for the owner or user of the yet-to-be-manufactured lighting system. A user or owner may benefit from a visualization of glare—seeing which light sources are potential glare sources under different conditions (e.g., varying adaptation levels, different lines of sight). Further, glare calculations using existing lighting design tools do not address lighting systems already installed. If a user is experiencing discomfort in his/her office space, for example, there are not tools available to bring to the actual space, quantify what is primarily a subjective experience by the user, and identify ways to correct the situation (or avoid it in future lighting projects). As such, the art of lighting design is limited in the ways in which and to what degree glare science may be incorporated and thus, there is room for improvement in the art.

III. SUMMARY OF THE INVENTION

Existing lighting design tools may benefit from the inclusion of apparatuses, methods, or systems to indicate glare, and more particularly, the threshold at which glare poses an actual problem (e.g., as determined by a user, a particular glare model/metric, a combination of user experience and glare model/metric, or something else). This benefit could be particularly well realized in outdoor lighting applications; specifically, sports lighting applications. Many of the lighting design tools already available in the industry are geared towards understanding the nature of light in an indoor space such as an office (see, e.g., the aforementioned the Radiance Synthetic Imaging System). As previously stated, these tools are very useful in lighting design. That being said, many existing light design tools lack a direct correlation between the visualization of light in a space and how that light can be effectively produced from a product standpoint. With respect to sports lighting, integrating glare-indicating apparatuses, methods, or systems into existing tools that are used to view, document, or evaluate existing lighting systems may permit a lighting designer to identify areas of concern and provide correction to an existing lighting system; by adding baffles or re-aiming lighting fixtures in the previous example of an office worker experiencing discomfort, for example. This diagnostic (i.e., retrofit) approach to considering glare perception in lighting design could yield valuable information about the human experience. This, in turn, could lead to a more predictive approach to considering glare perception in lighting design. A lighting designer could evaluate perceived glare of a virtual lighting design (e.g., such as may be created using the aforementioned AGi32 software), and provide correction before any lighting equipment is manufactured—and in a manner that (i) takes into consideration an actual user rather than (or in addition to) a standard glare model (e.g., GR, UGR), and (ii) provides a visualization of where and when glare poses an actual problem.

It is therefore a principle object, feature, advantage, or aspect of the present invention to improve over the state of the art and/or address problems, issues, or deficiencies in the art.

Exemplary glare-indicating apparatuses, methods, and systems are hereby presented which are readily implemented in a diagnostic or predictive mode, adaptable in accordance with different end users and advances in glare science, and either avoid or overcome the limitations of existing glare models (some examples of which are later discussed).

Further objects, features, advantages, or aspects of the present invention may include one or more of the following:
a. apparatuses, methods, or systems for defining and visually indicating glare thresholds using existing lighting design tools;
b. apparatuses, methods, or systems for redefining said visual indication of glare thresholds as greater insight into glare science is achieved, different subjects are polled, or new lighting design tools are developed;
c. apparatuses, methods, or systems for redefining said visual indication of glare thresholds based on expected lines-of-sight for a given environment, anticipated eye adaptation, or other factors (e.g., additivity) that are known or discovered to affect the perception of glare;
d. apparatuses, methods, or systems for distinguishing between onsite and offsite glare;
e. apparatuses, methods, or systems for providing real-time evaluation of visually indicated glare thresholds in a variety of environments; and
f. apparatuses, methods, or systems for automatically modifying a virtual lighting design to avoid glare based, at least in part, on a glare threshold.

These and other objects, features, advantages, or aspects of the present invention will become more apparent with reference to the accompanying specification.

IV. BRIEF DESCRIPTION OF THE DRAWINGS

The patent or application file contains at least one drawing executed in color. Copies of this patent or patent application publication with color drawing(s) will be provided by the Office upon request and payment of the necessary fee.

From time-to-time in this description reference will be taken to the drawings which are identified by figure number and are summarized below.

FIG. 2A illustrates a smart phone-type device, and

FIG. 2B illustrates a tablet-type device.

Figure 3:
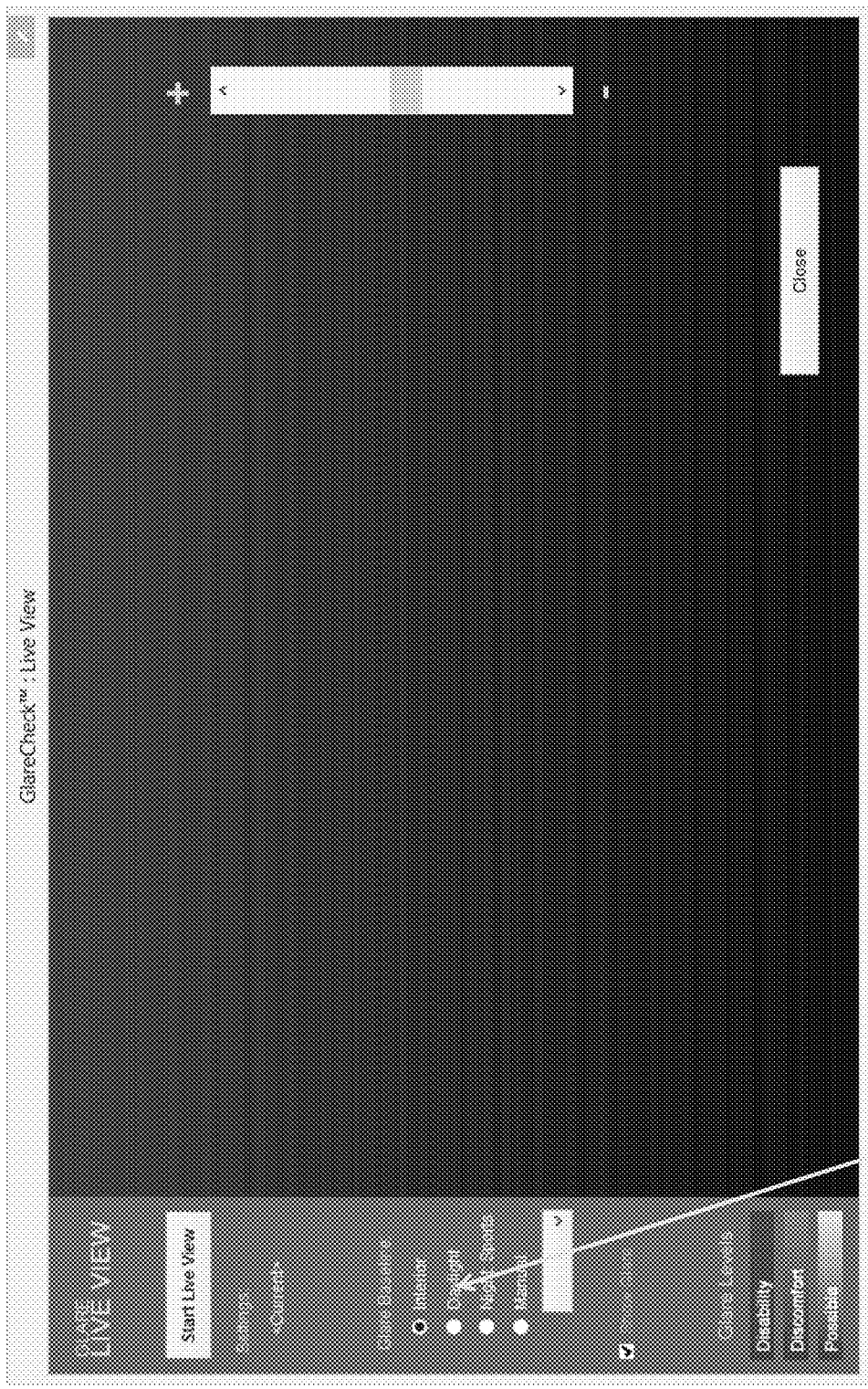
FIGS. 3-7 illustrate various screenshots of one possible software program for use with the apparatuses of FIGS. 1-2B.
Figure 4:
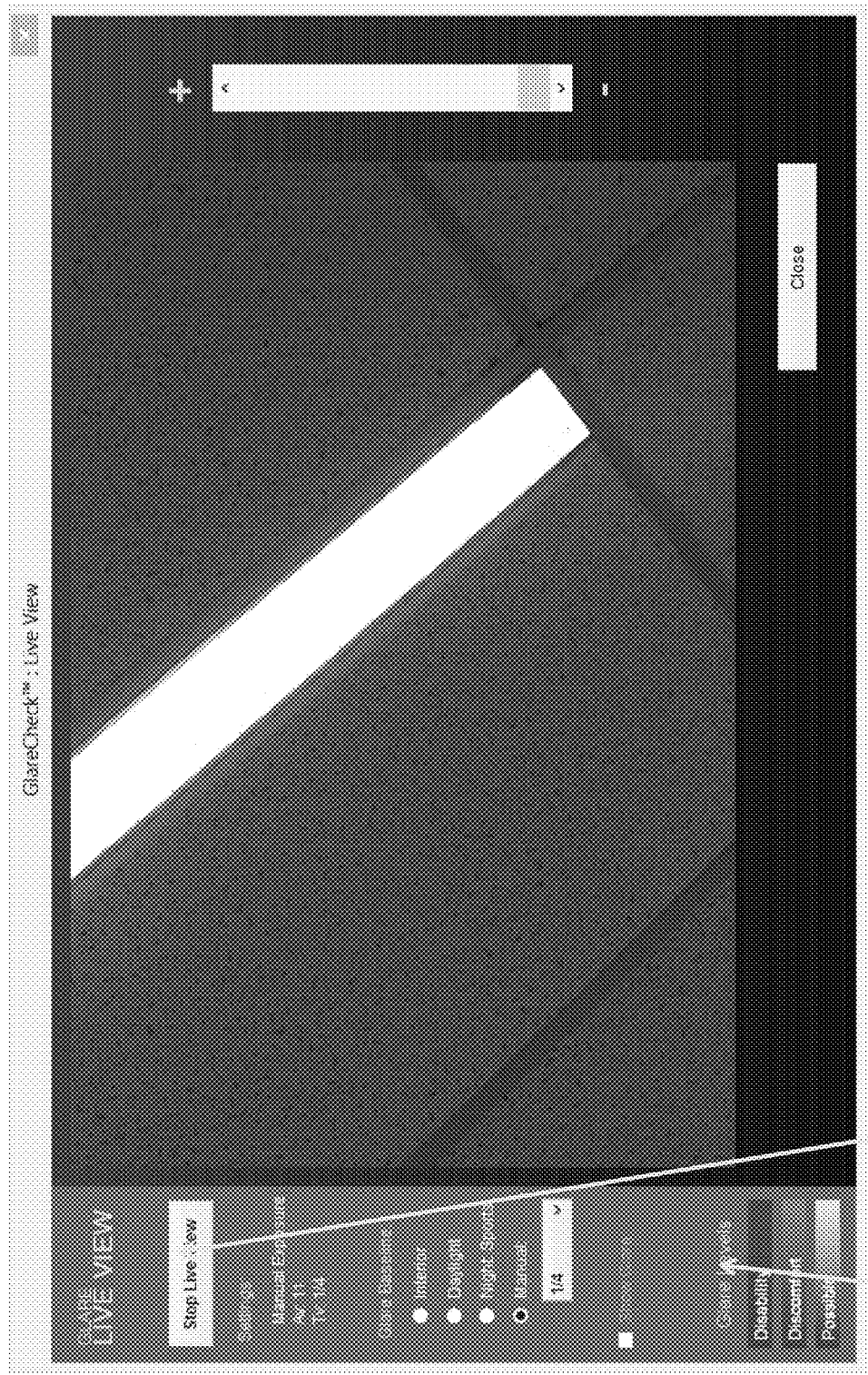
Figure 5:
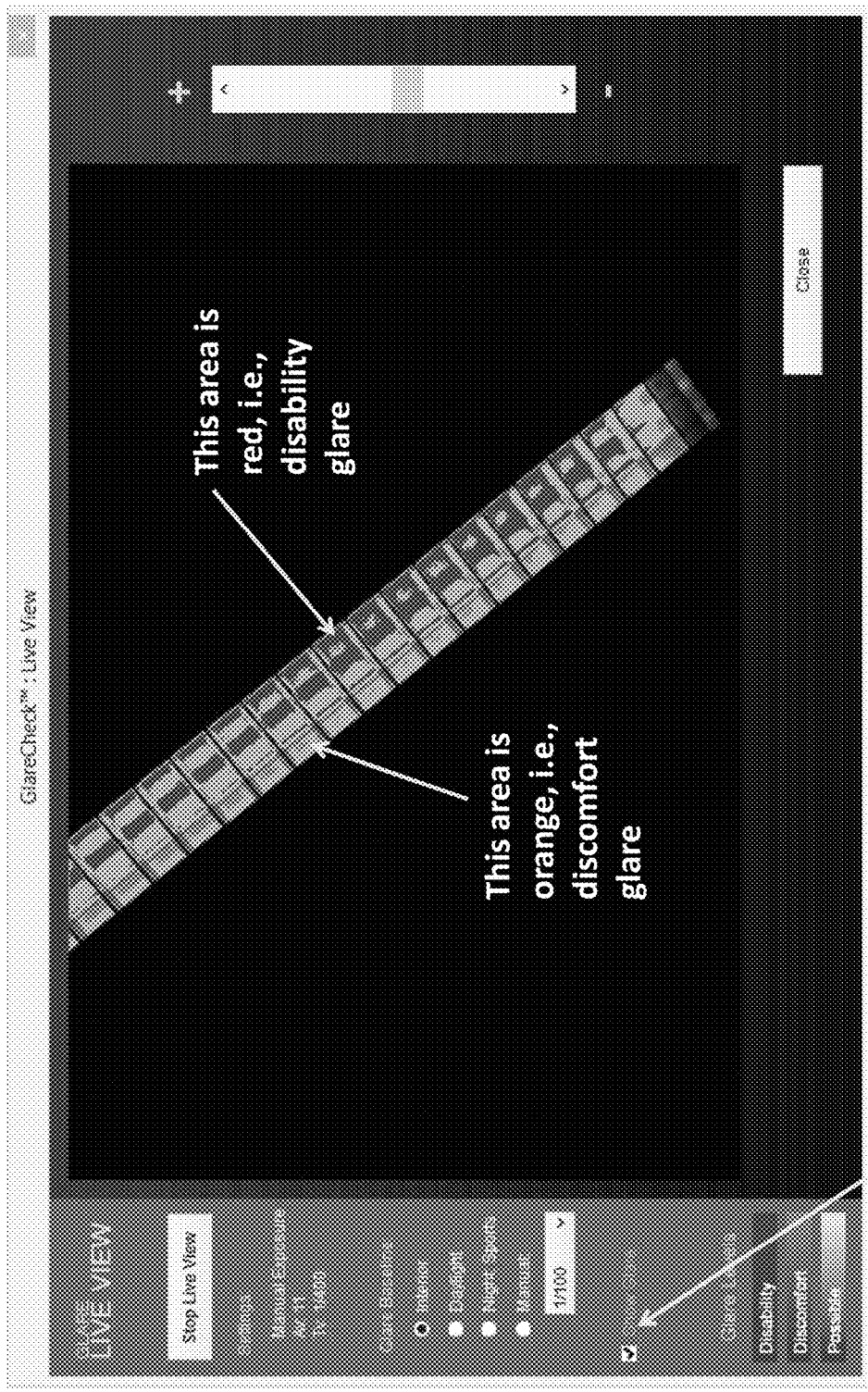
Figure 6:
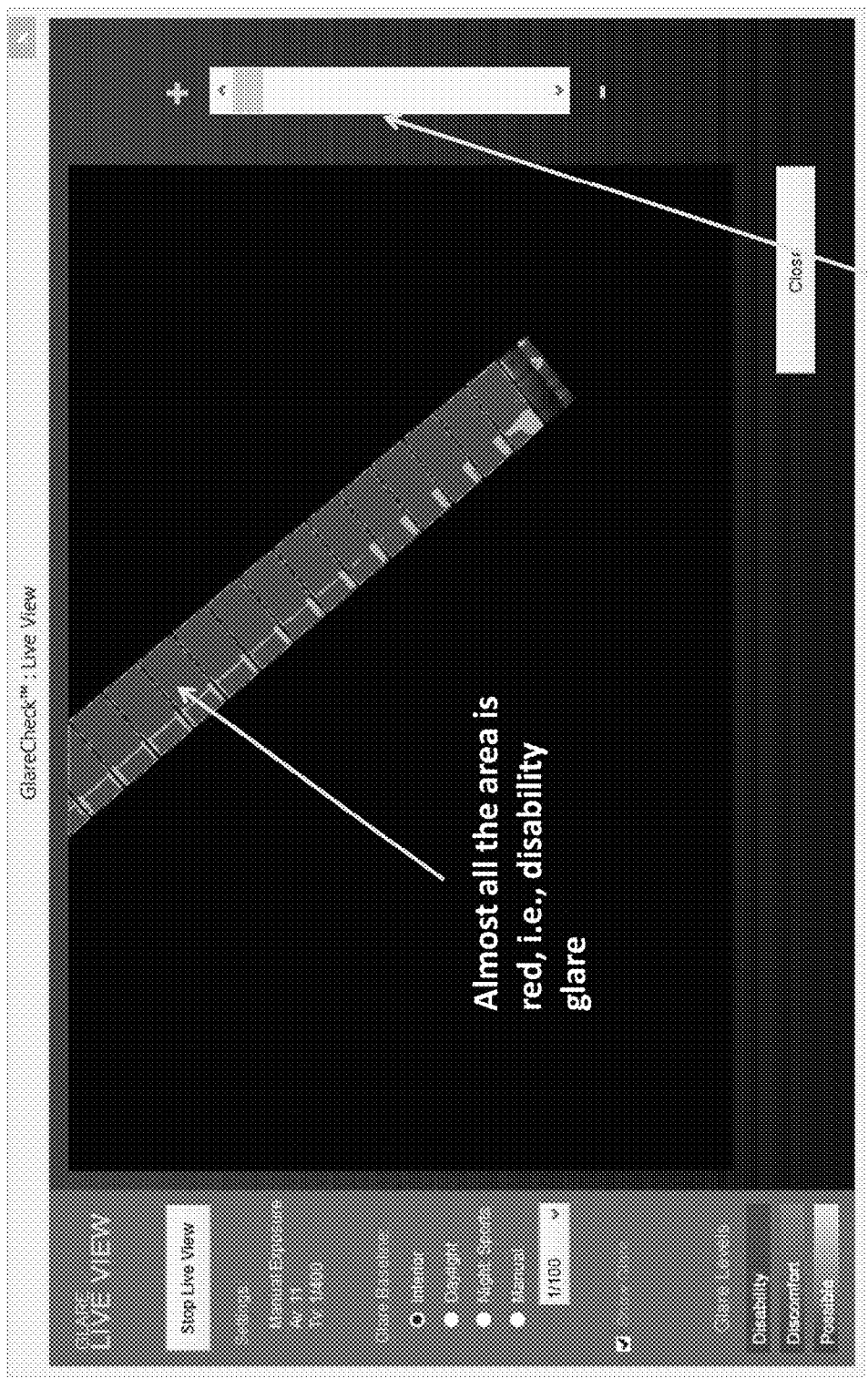
Figure 7:
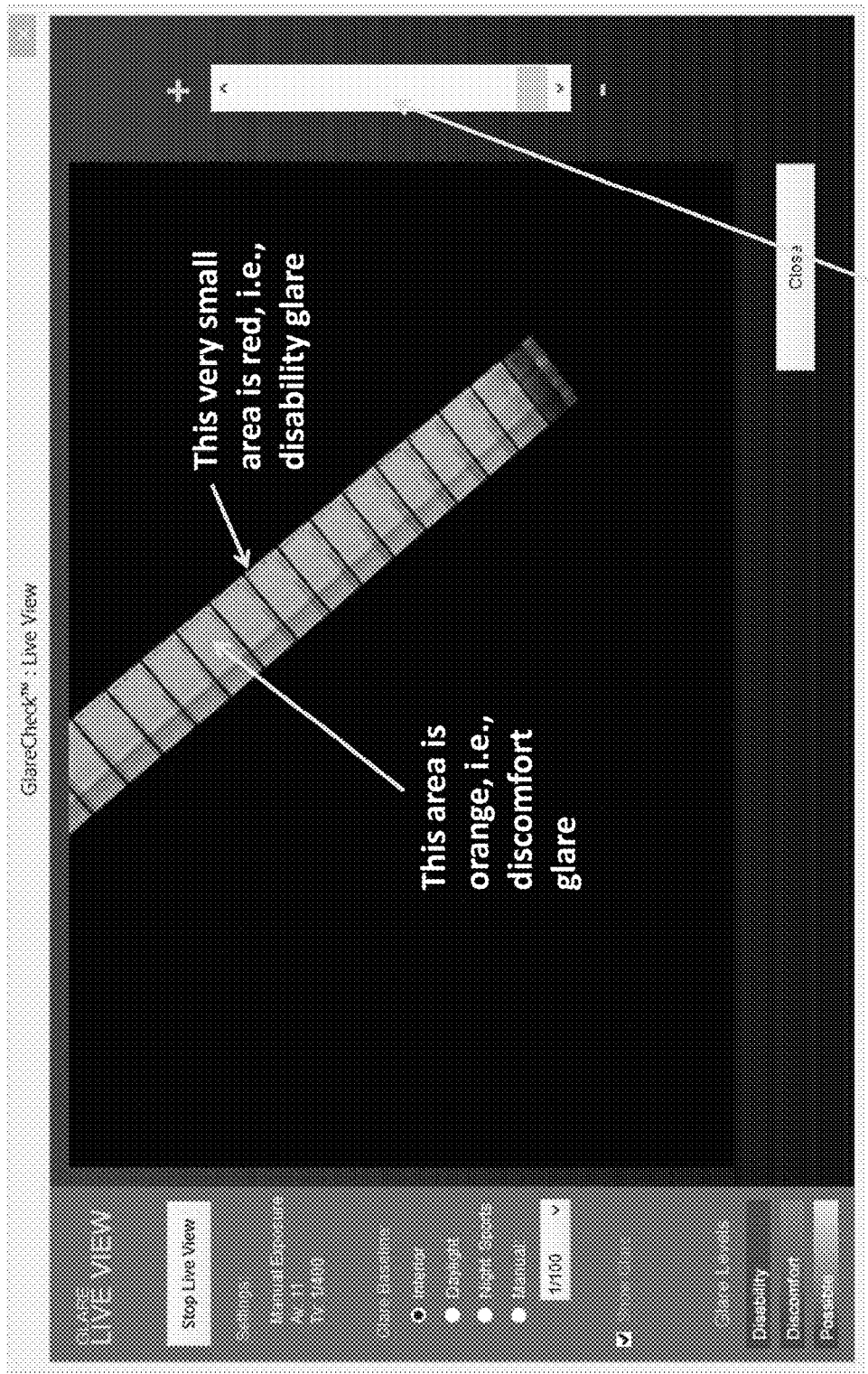

FIG. 3 illustrates a screenshot from a proprietary software program in which a glare baseline is defined, FIG. 4 illustrates a screenshot from a proprietary software program in which a live view of a potential glare source is identified, FIG. 5 illustrates a screenshot from a proprietary software program in which visualization of a glare threshold is produced, and FIGS. 6 and 7 illustrate the change to the glare threshold visualization in response to a change in glare thresholds.

Figure 8:
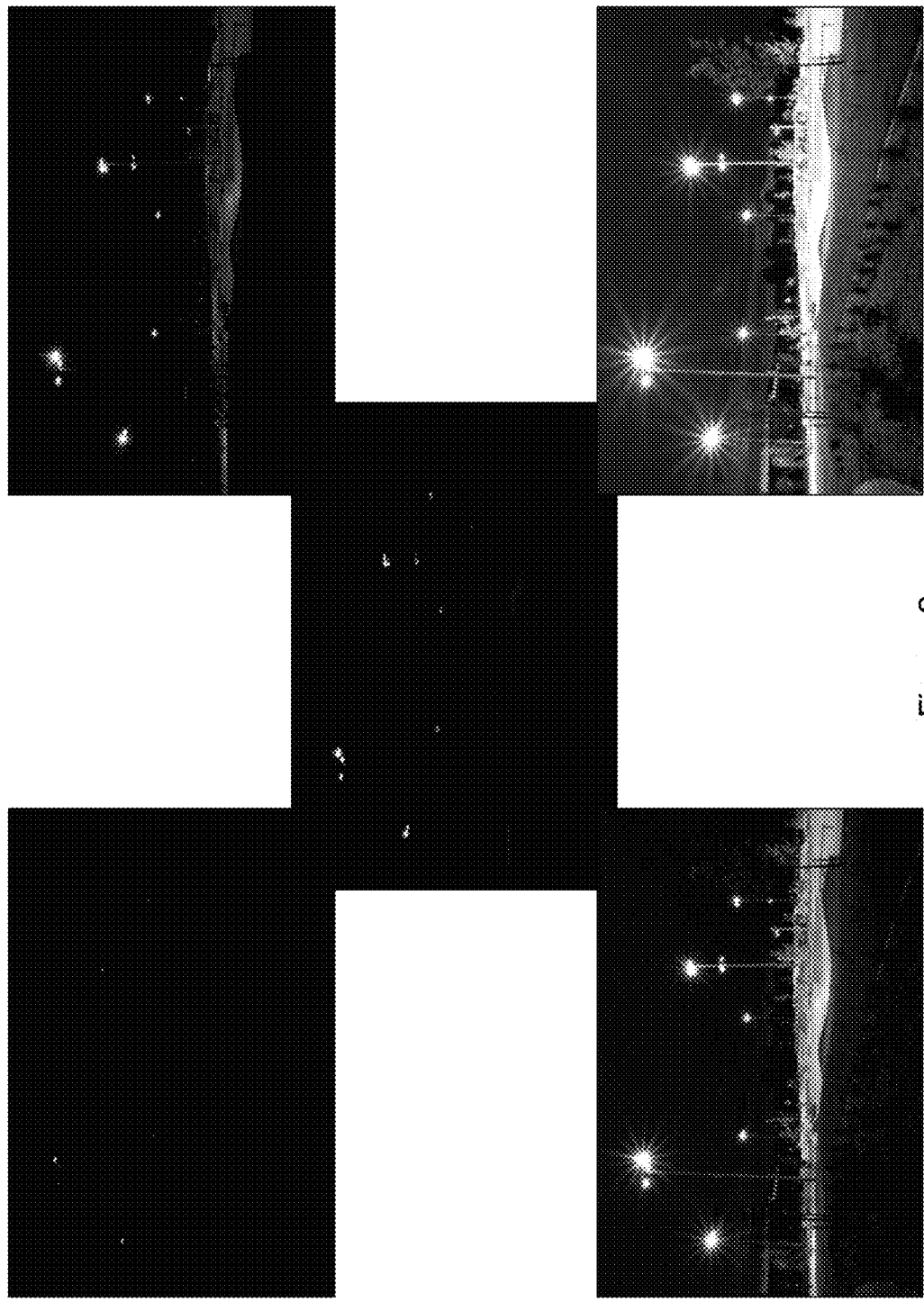

FIG. 8 illustrates multiple photographs taken of an example target area from the same location and aperture setting but at different exposures.

Figure 9:

FIG. 9 illustrates a high-dynamic-range image formed, at least in part, from the individual images of FIG. 8.

Figure 10:
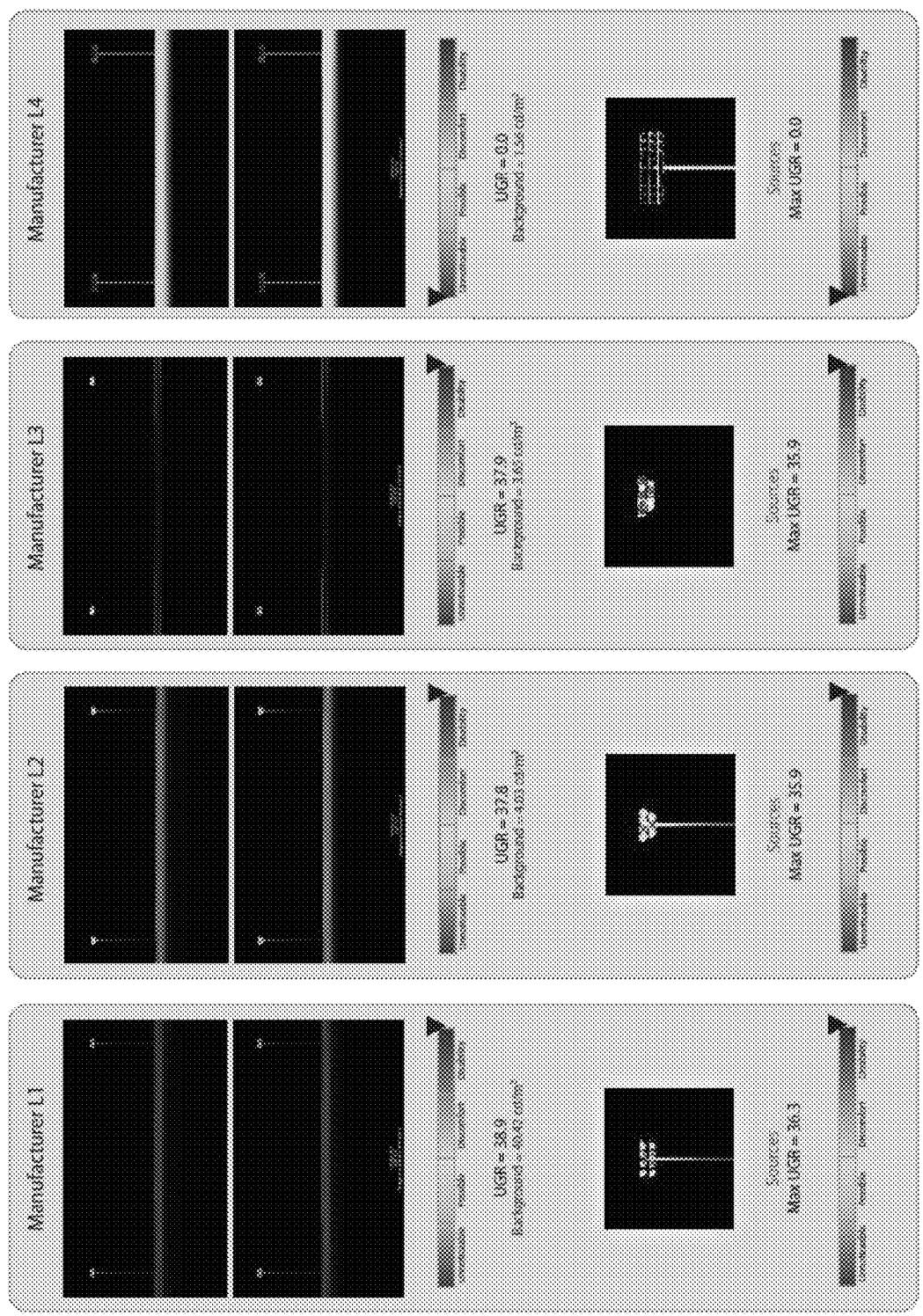

FIG. 10 illustrates one possible means of comparing different potential glare sources according to aspects of the present invention using a high-dynamic range image generated within a software program.

Figure 11:
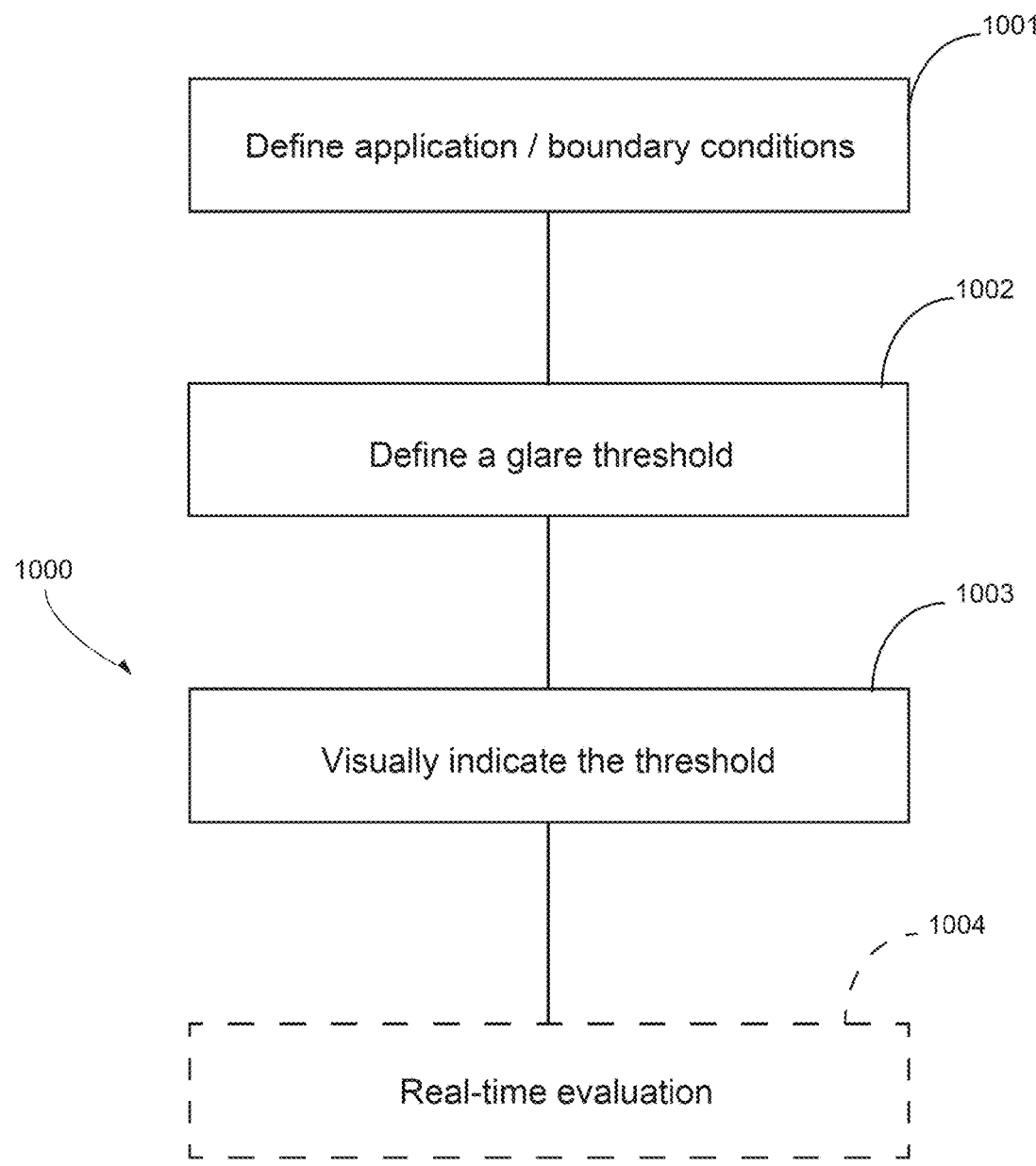

FIG. 11 illustrates one possible method of producing a visualization of perceived glare such as is illustrated in FIGS. 5-7 and 10 according to aspects of the present invention.

Figure 12:
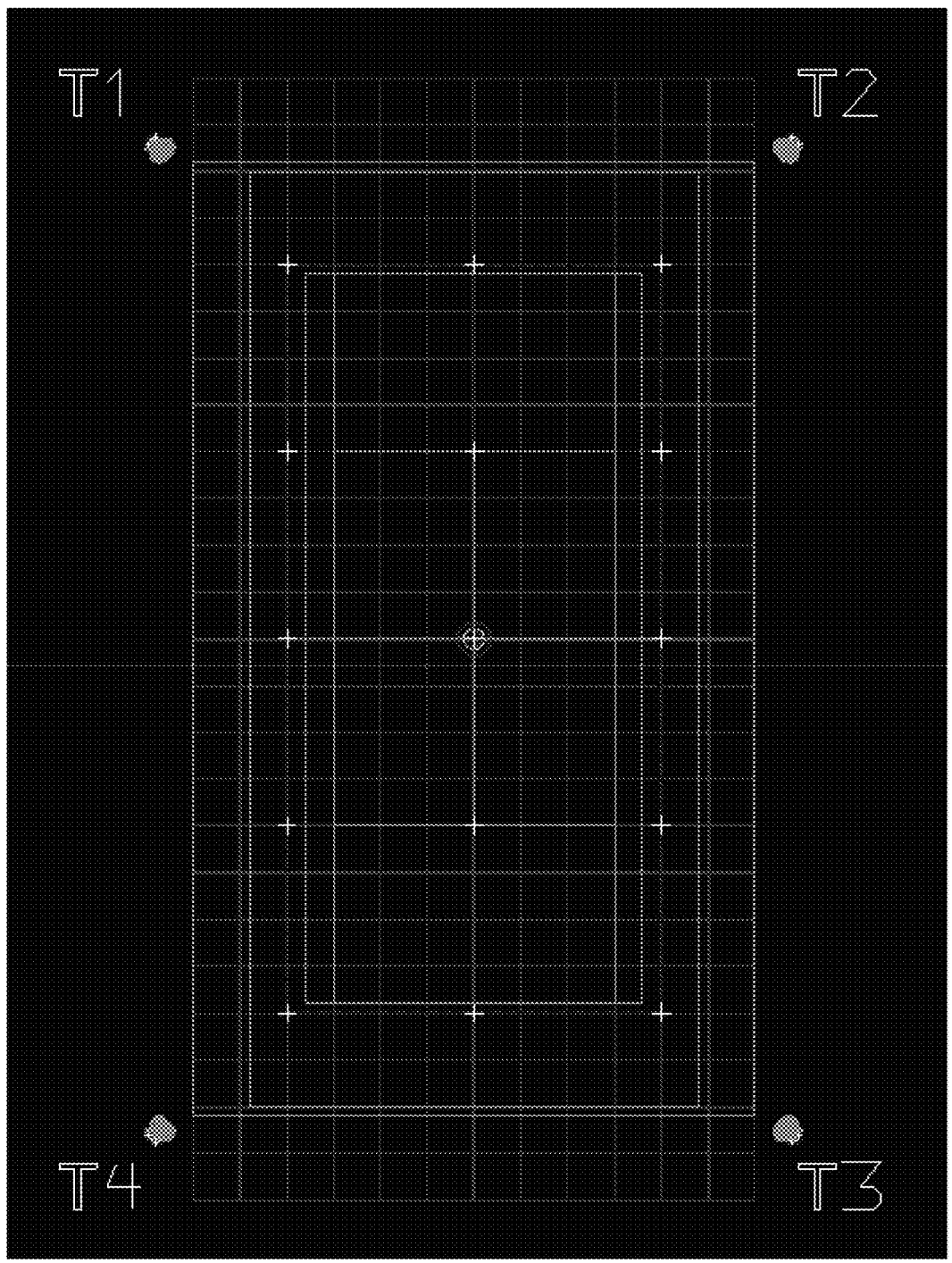

FIG. 12 illustrates a virtual lighting design for a tennis court with a four-pole layout.

Figure 13A:
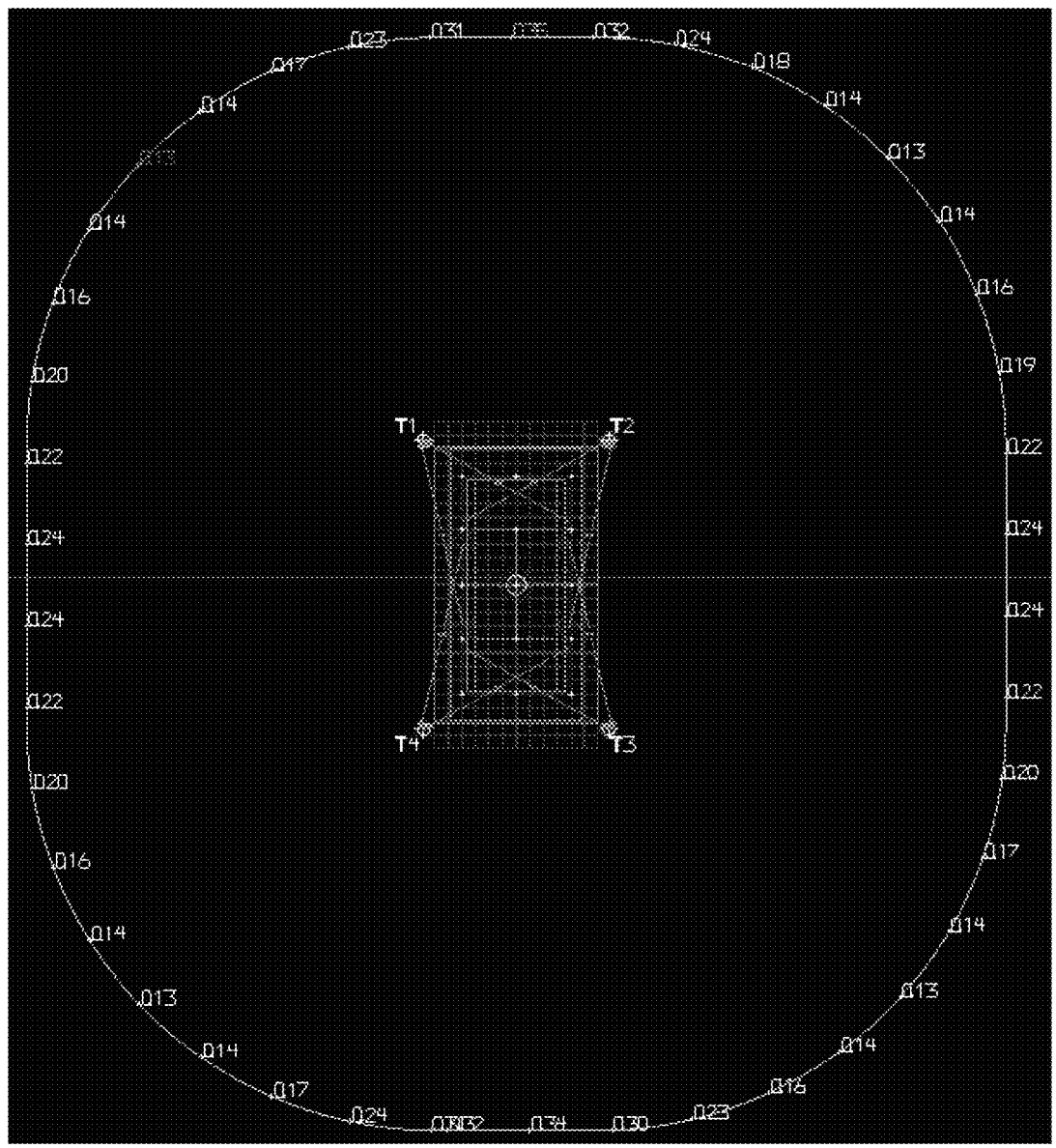

FIG. 13A illustrates a spill light line for a target area including the tennis court of FIG. 12 illuminated in accordance with the HID arrangement of Table 1.

Figure 13B:
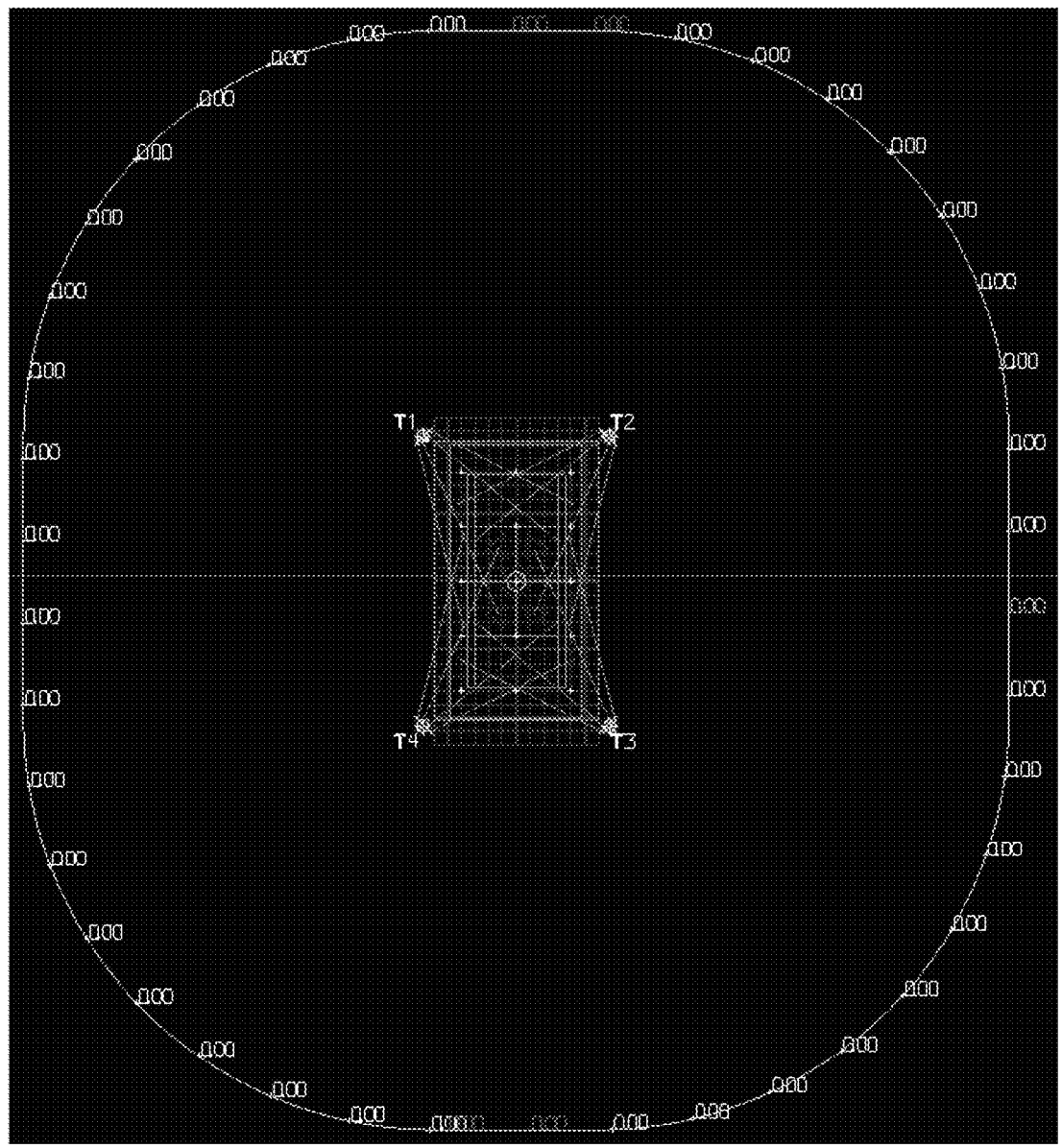

FIG. 13B illustrates a similar spill light line for the target area including the tennis court of FIG. 12 but as illuminated with the LED arrangement of Table 1.

Figure 14A:
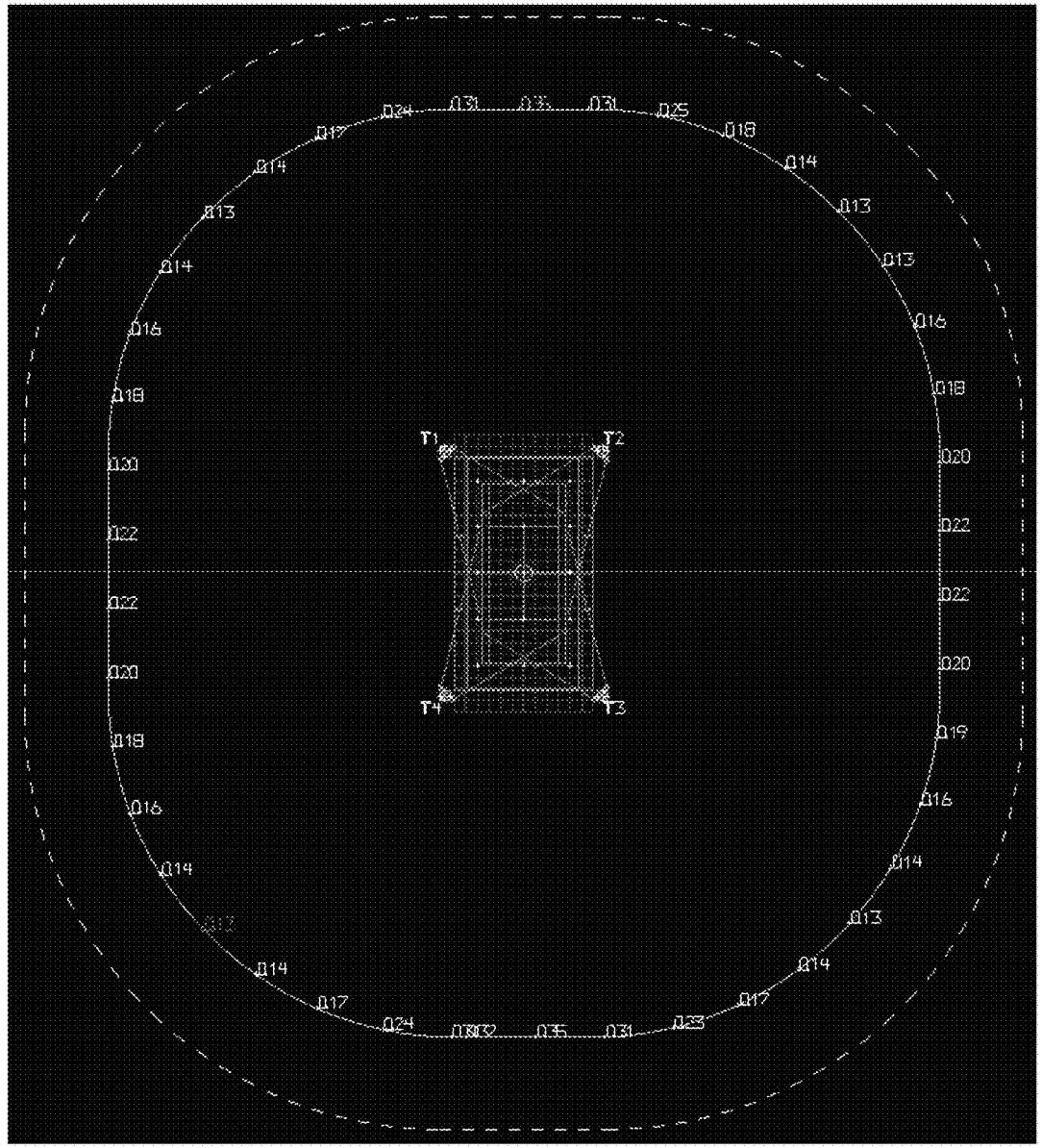
Figure 14B:
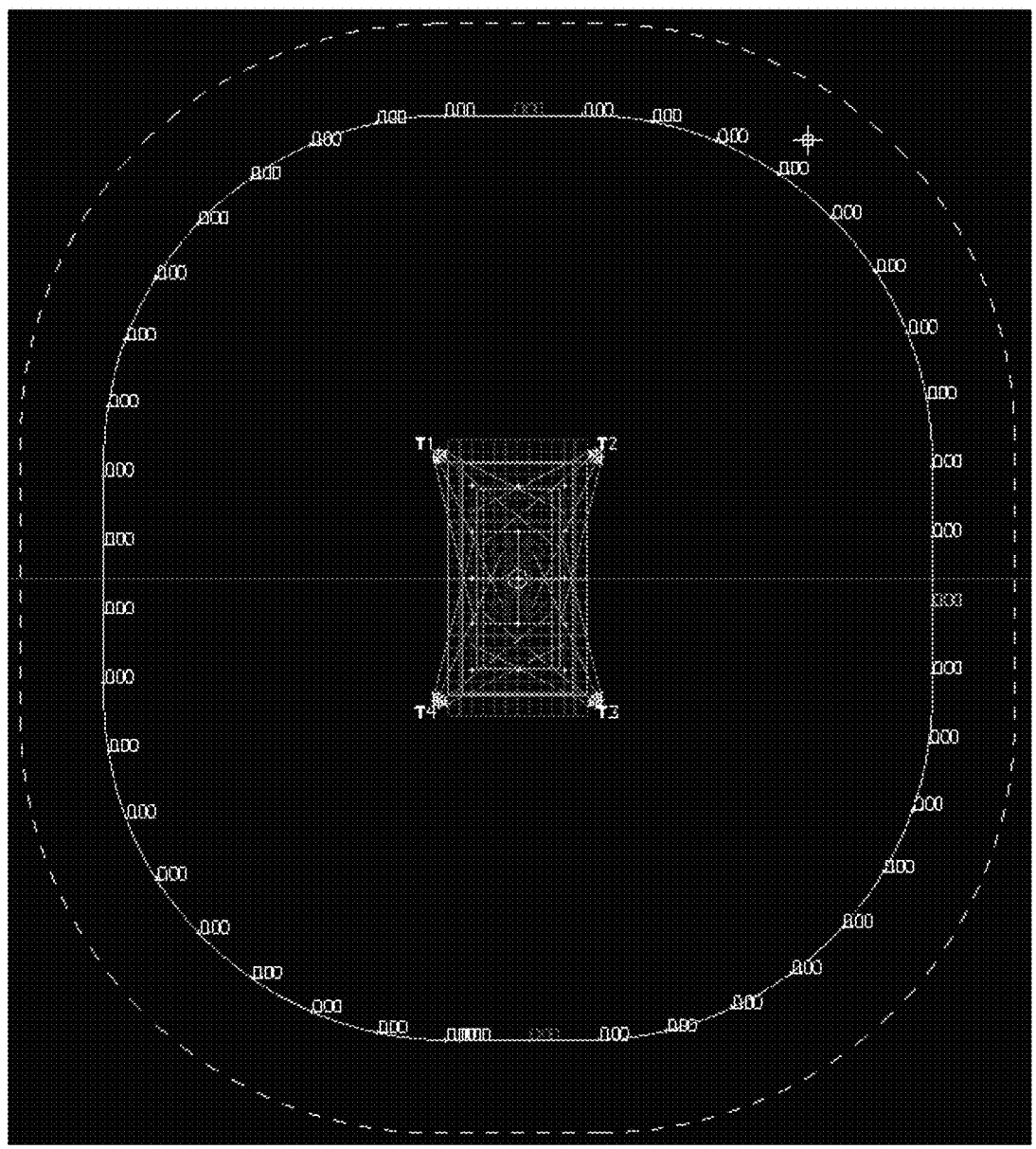

FIG. 14A illustrates one possible visualization of a glare threshold for the lighting design of FIG. 13A. FIG. 14B illustrates a similar glare threshold visualization for the lighting design of FIG. 13B.

Figure 15A:
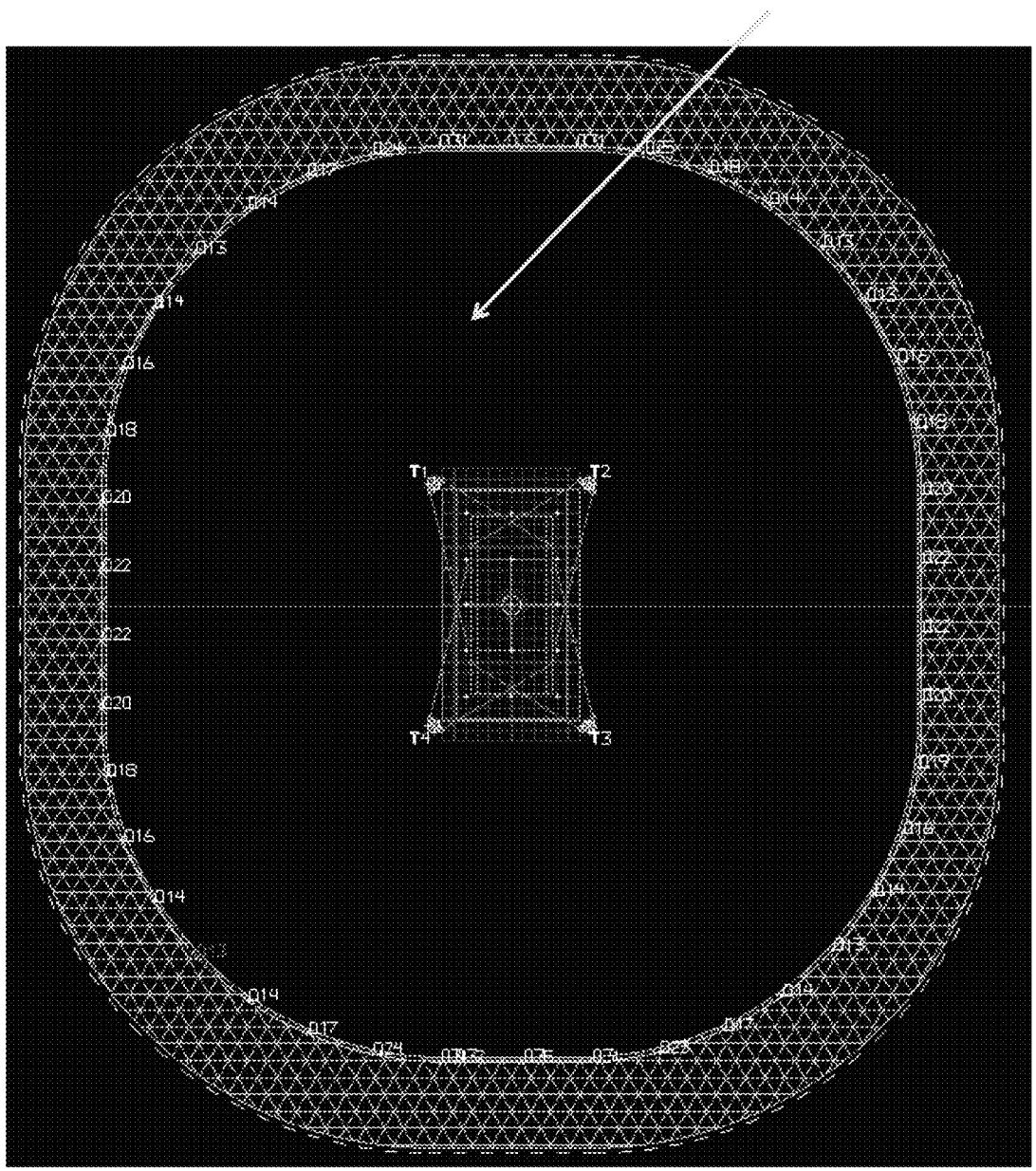
Figure 15B:
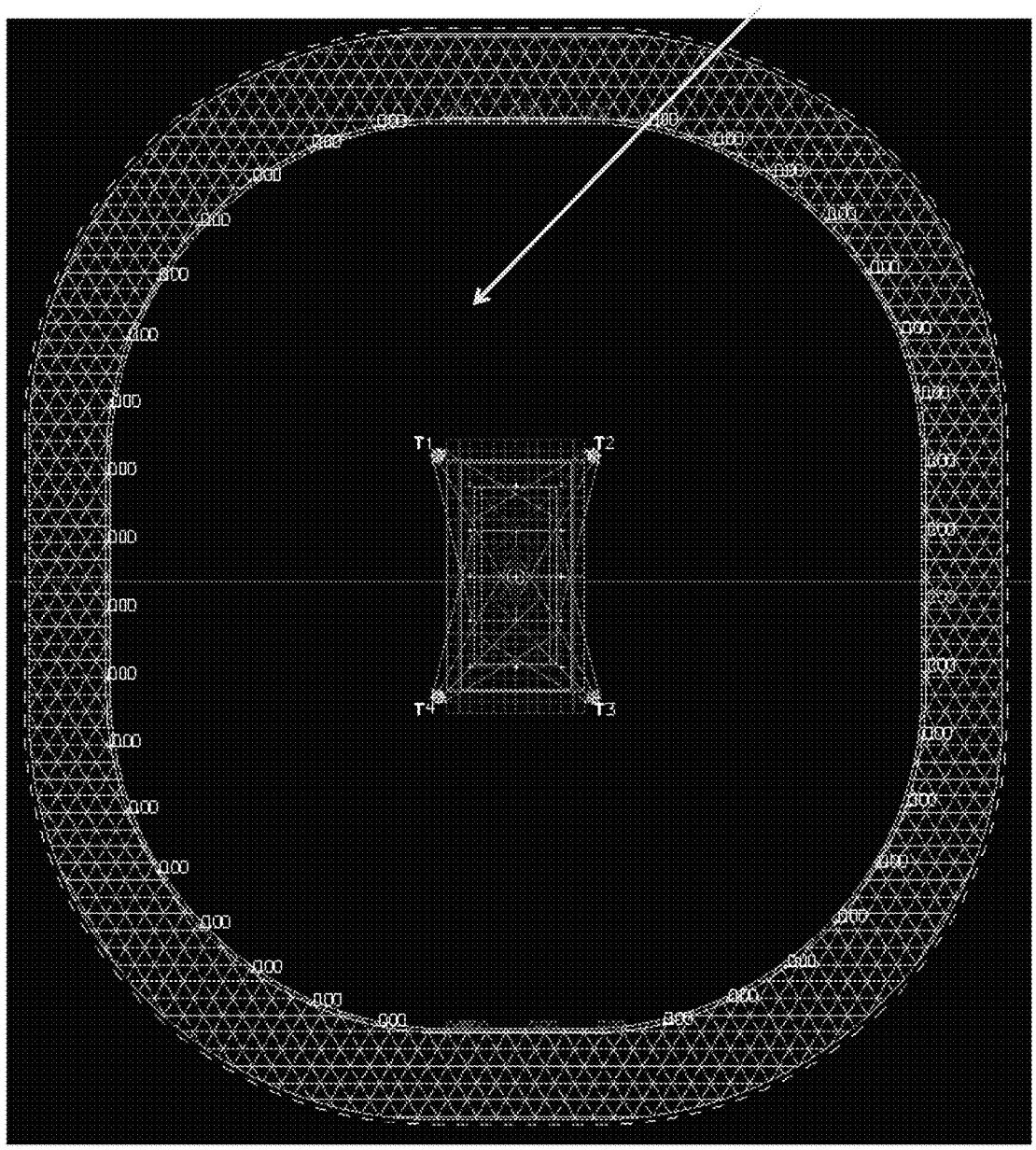

FIG. 15A illustrates one possible visualization of a glare zone—i.e., an area in which glare may be perceived based, at least in part, on the glare threshold of FIG. 14A—for the lighting design of FIG. 13A. FIG. 15B illustrates a similar glare zone for the lighting design of FIG. 13B based, at least in part, on the glare threshold of FIG. 14B.

Figure 16A:
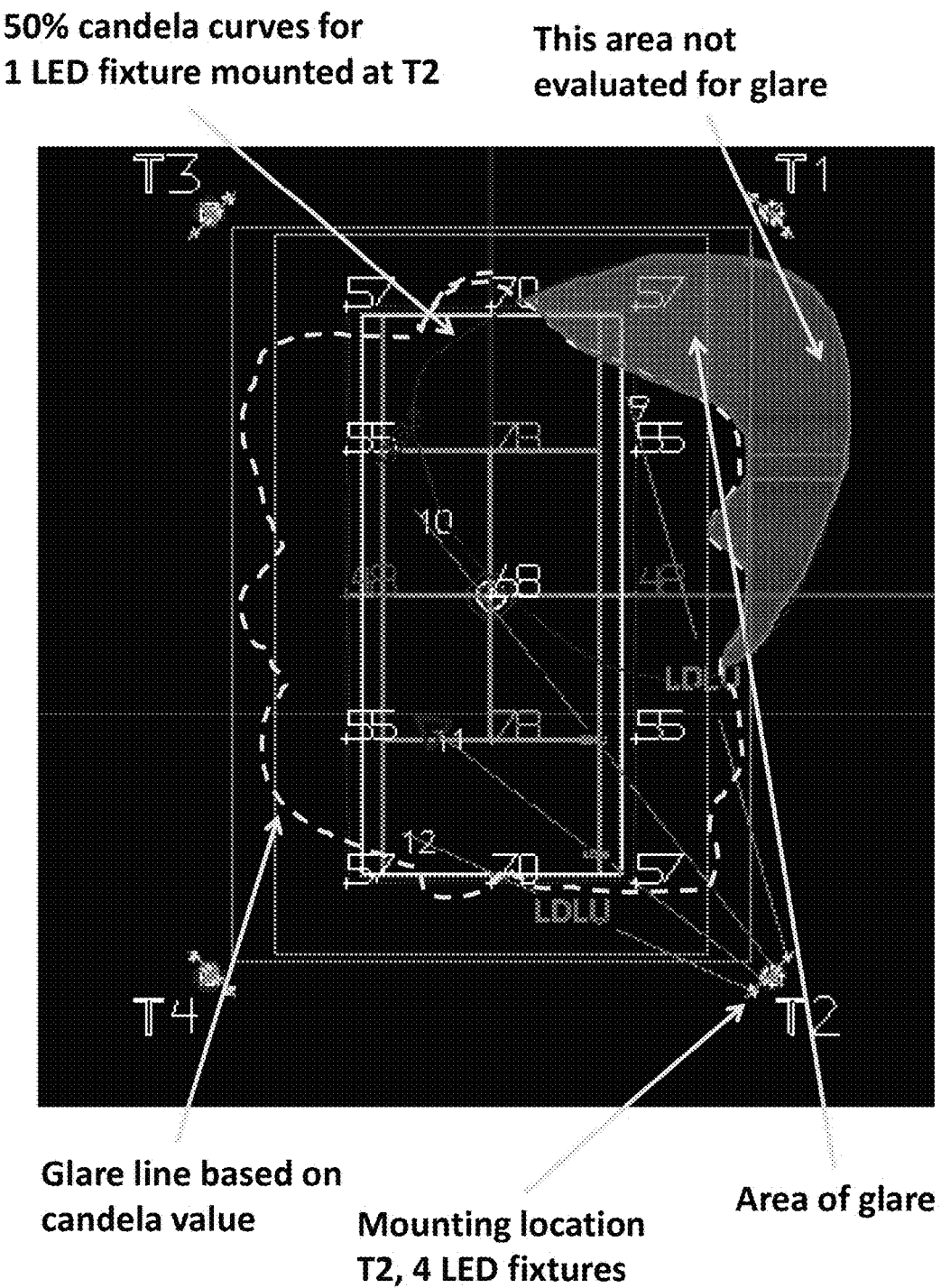
Figure 16B:
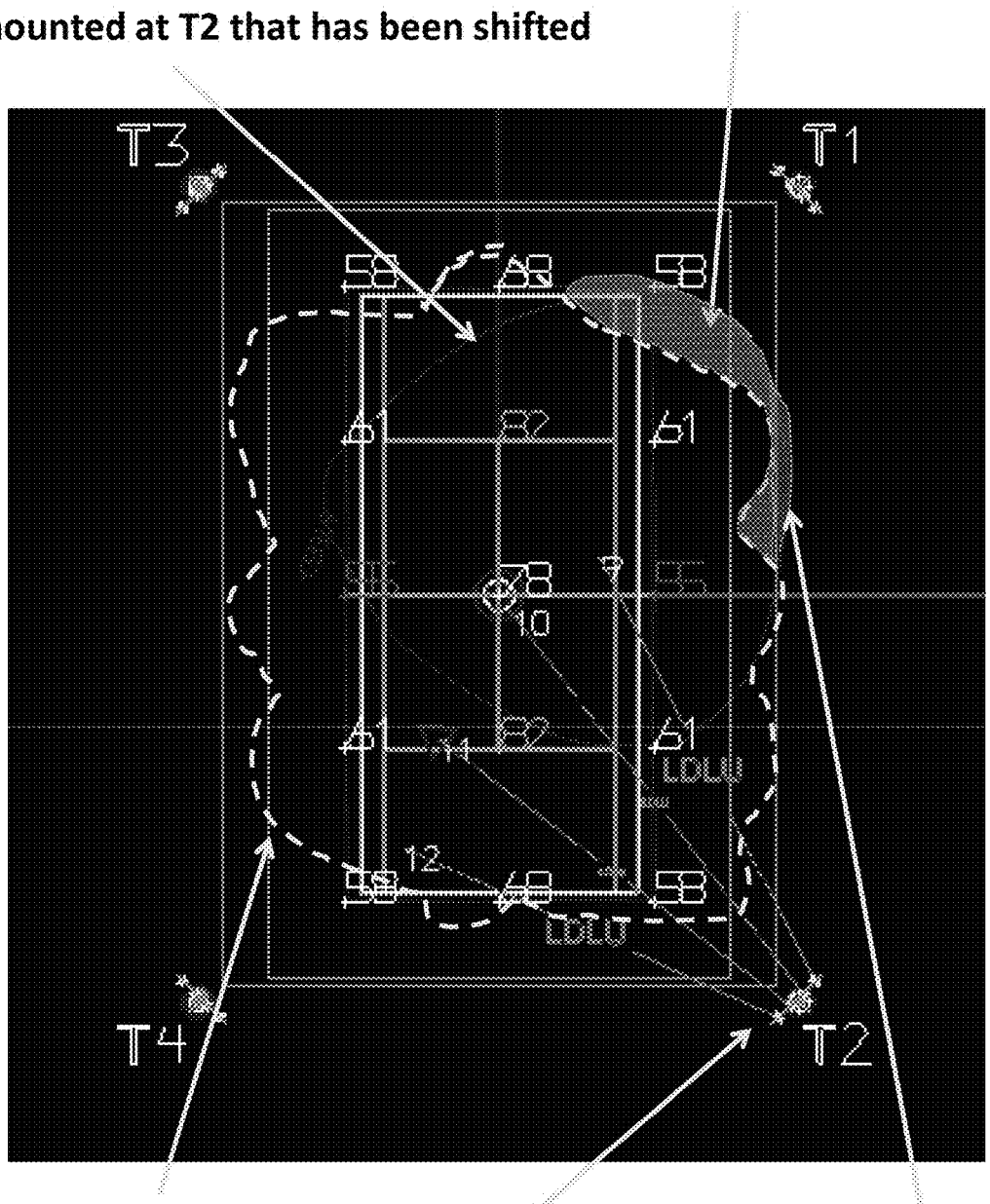

FIG. 16A illustrates an alternative approach to visualizing a glare zone according to aspects of the present invention—specifically onsite glare zones—for the lighting design of FIG. 13A. FIG. 16B illustrates a change to the glare zone of FIG. 16A in response to the re-aiming of one of the virtual light sources of FIG. 16A.

FIGS. 17-24 illustrate various screenshots of one possible software program to enable automatic re-aiming of virtual light sources according to aspects of the present invention.

Figure 17:
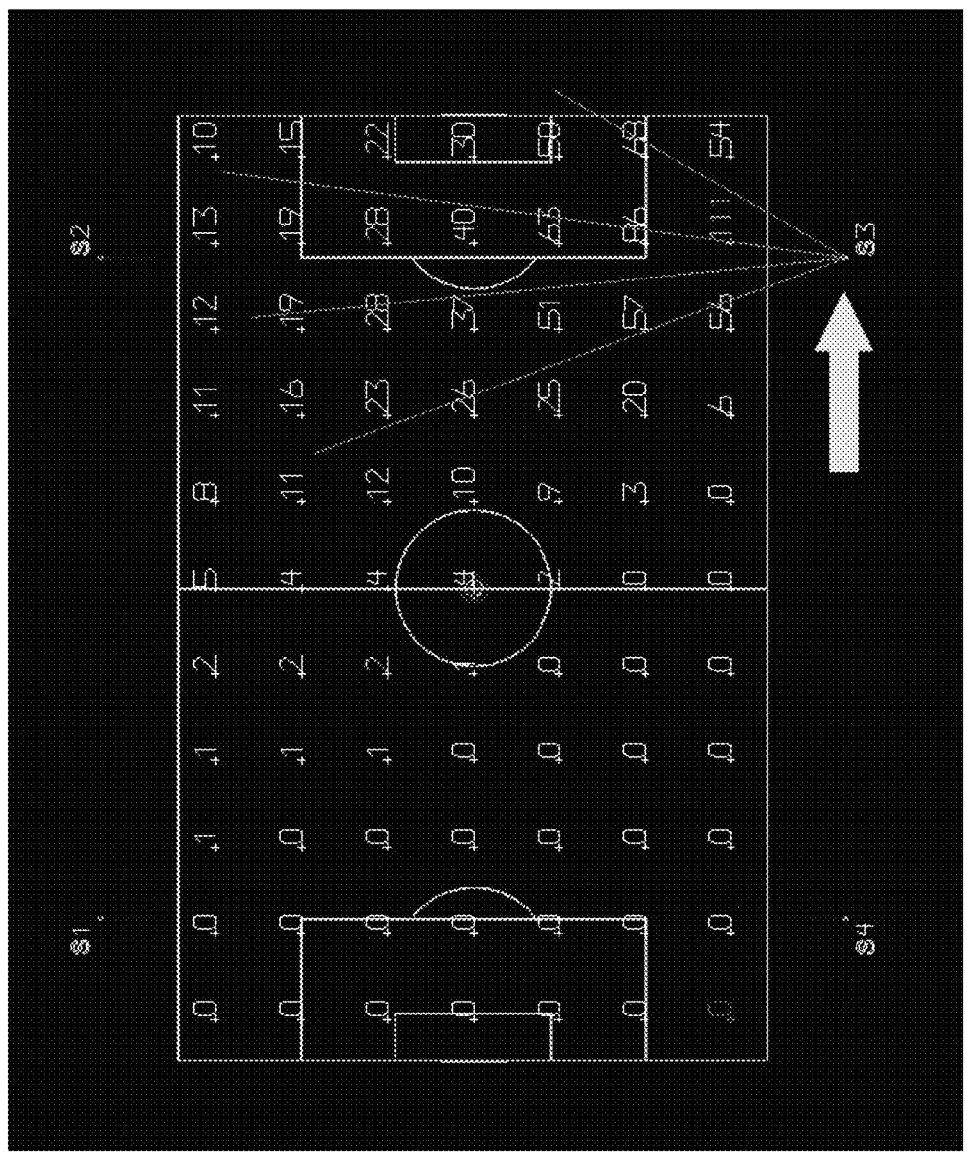
Figure 18:
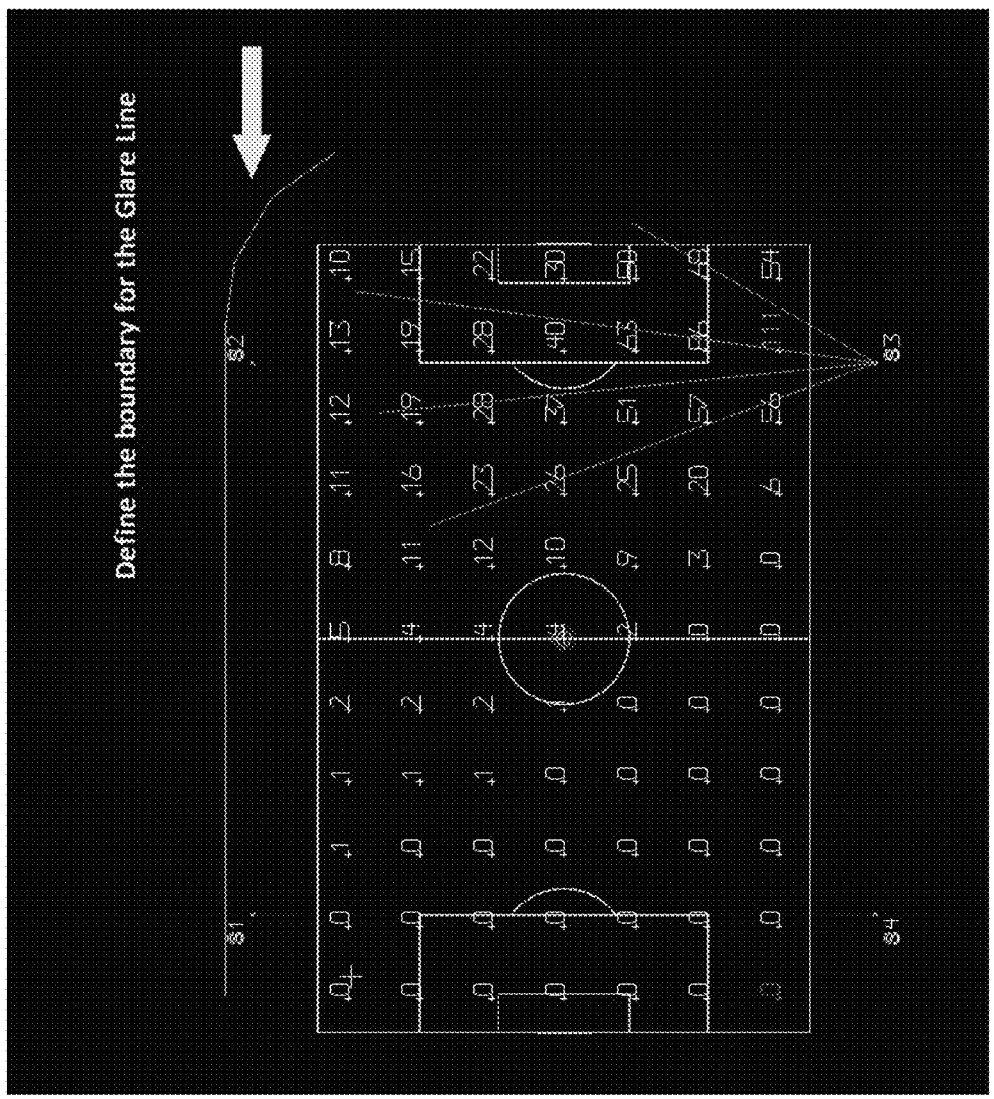
Figure 19:
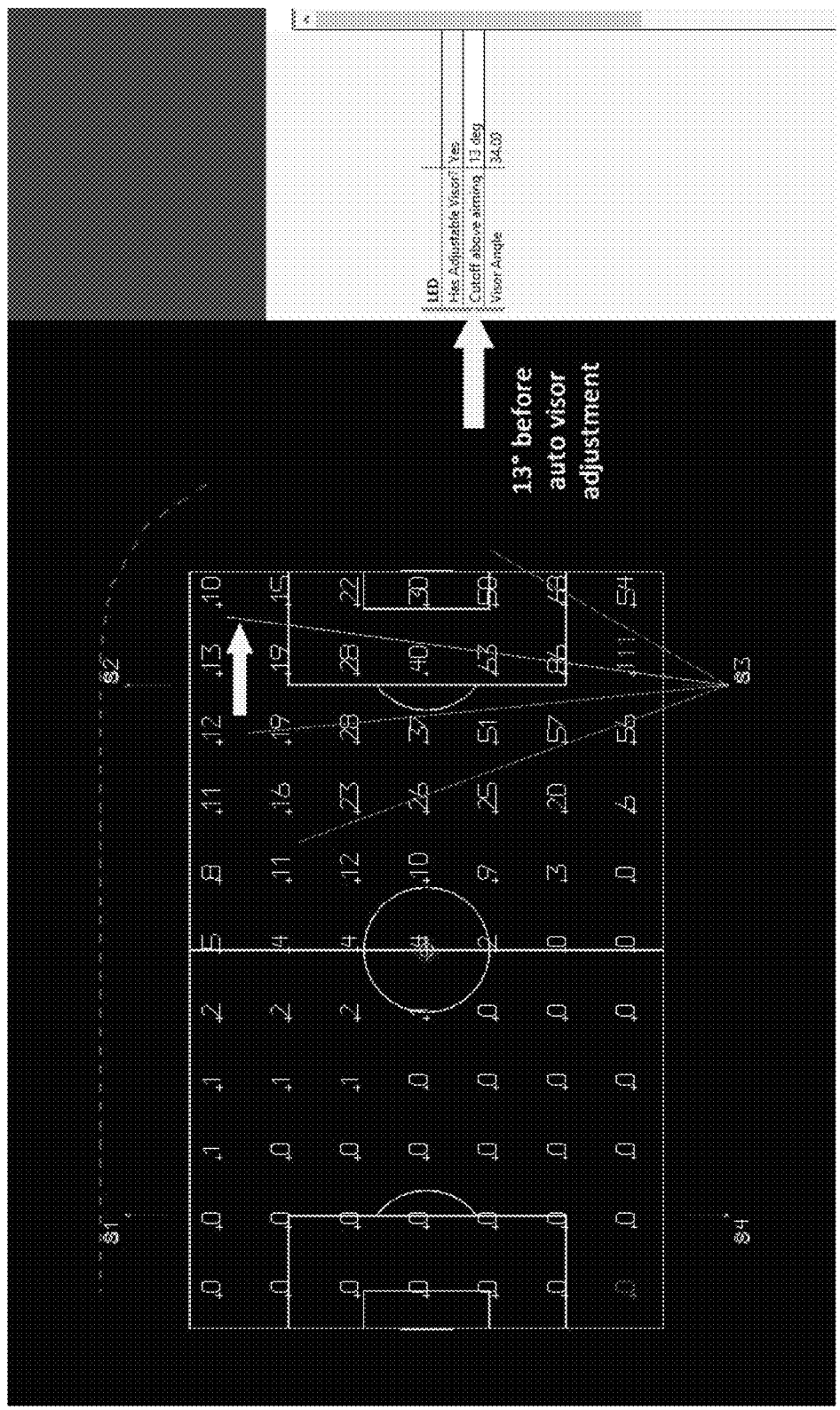
Figure 20:
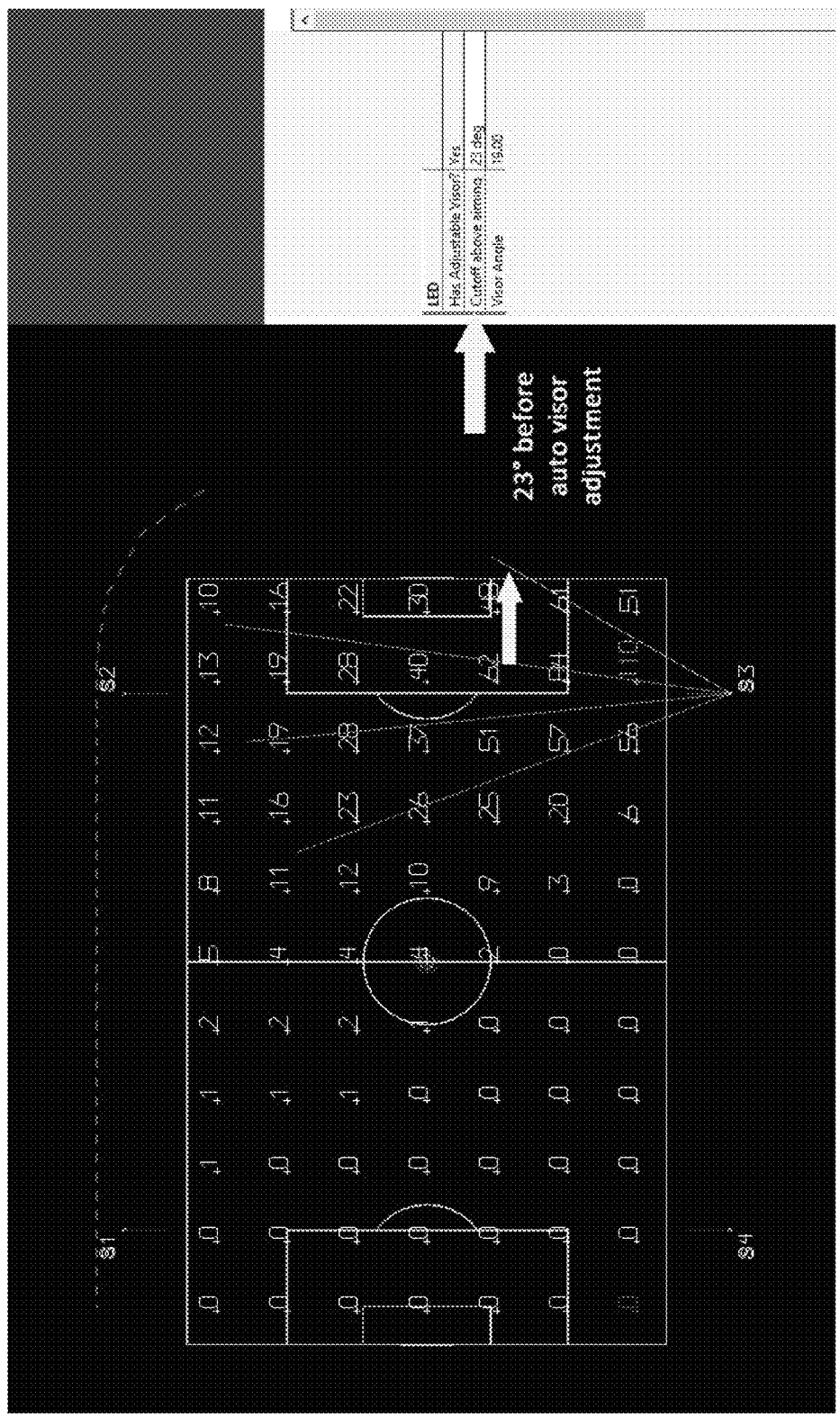
Figure 21:
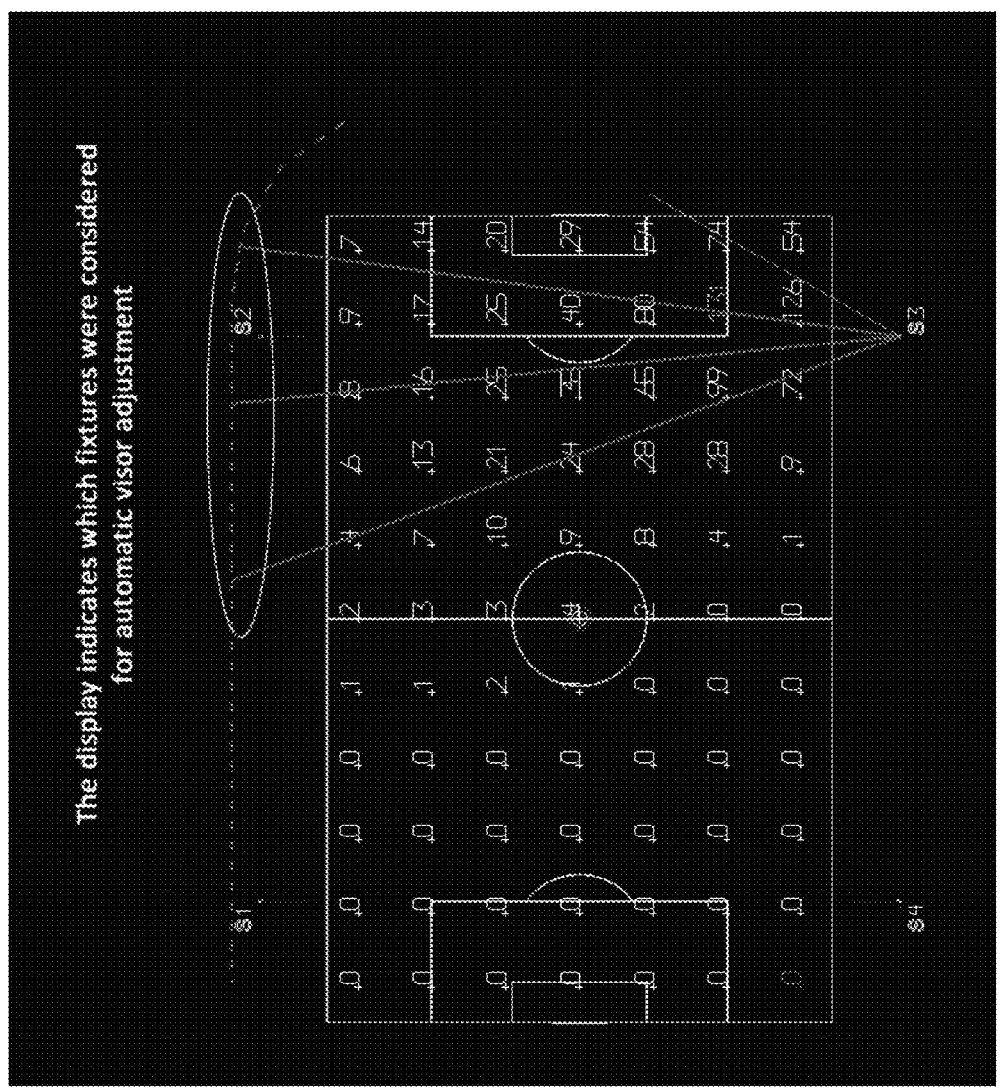
Figure 22:
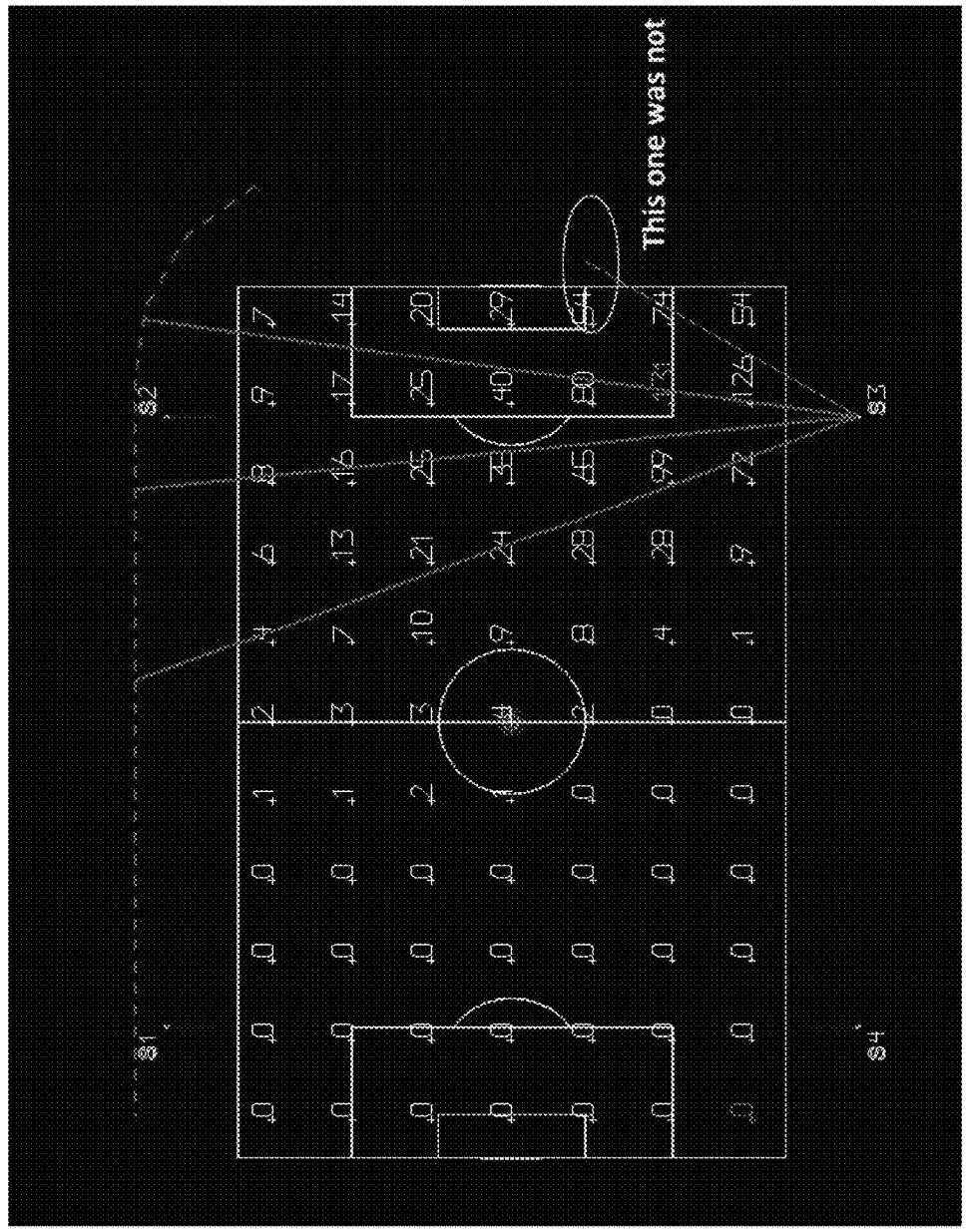
Figure 23:
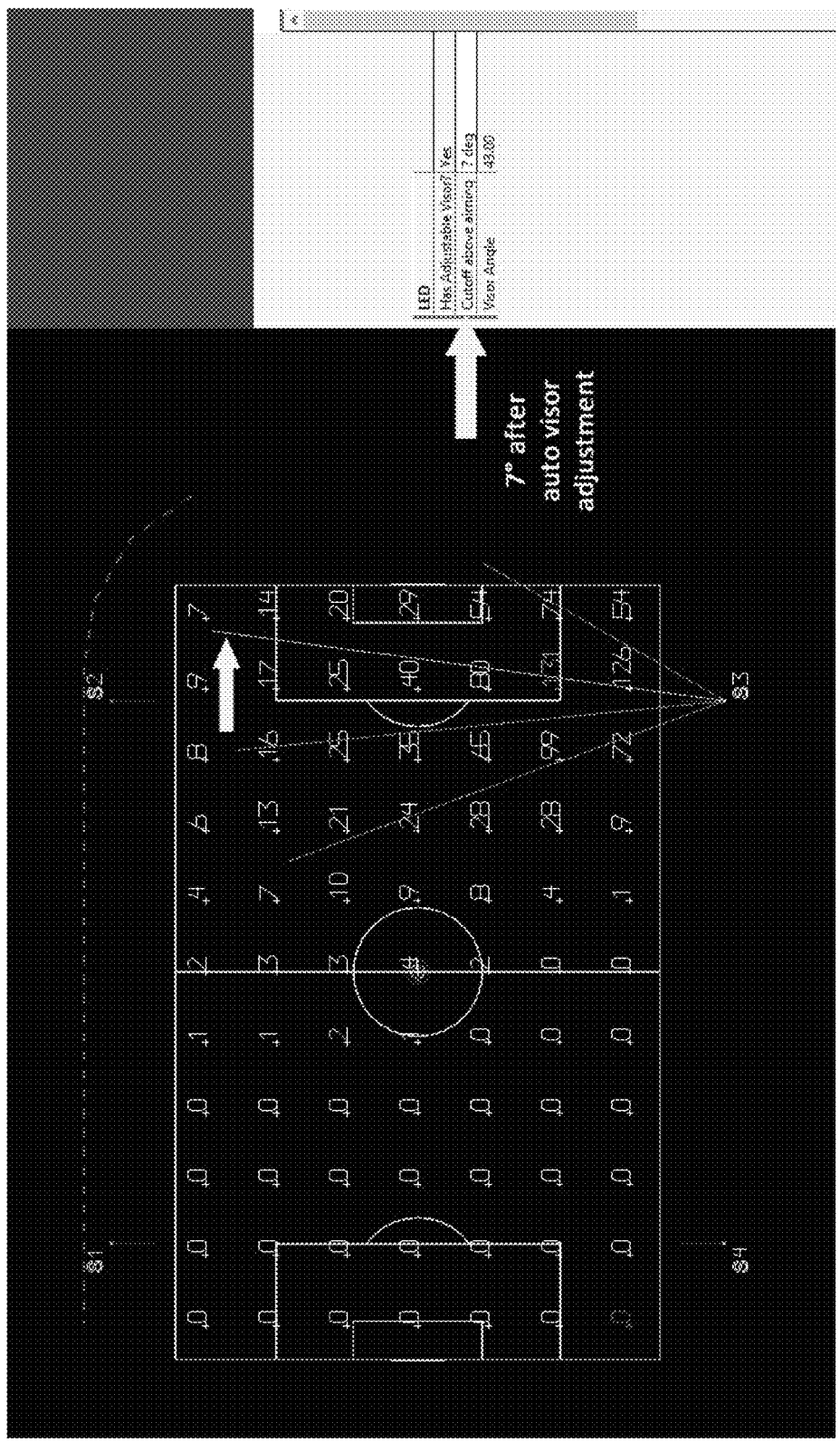
Figure 24:
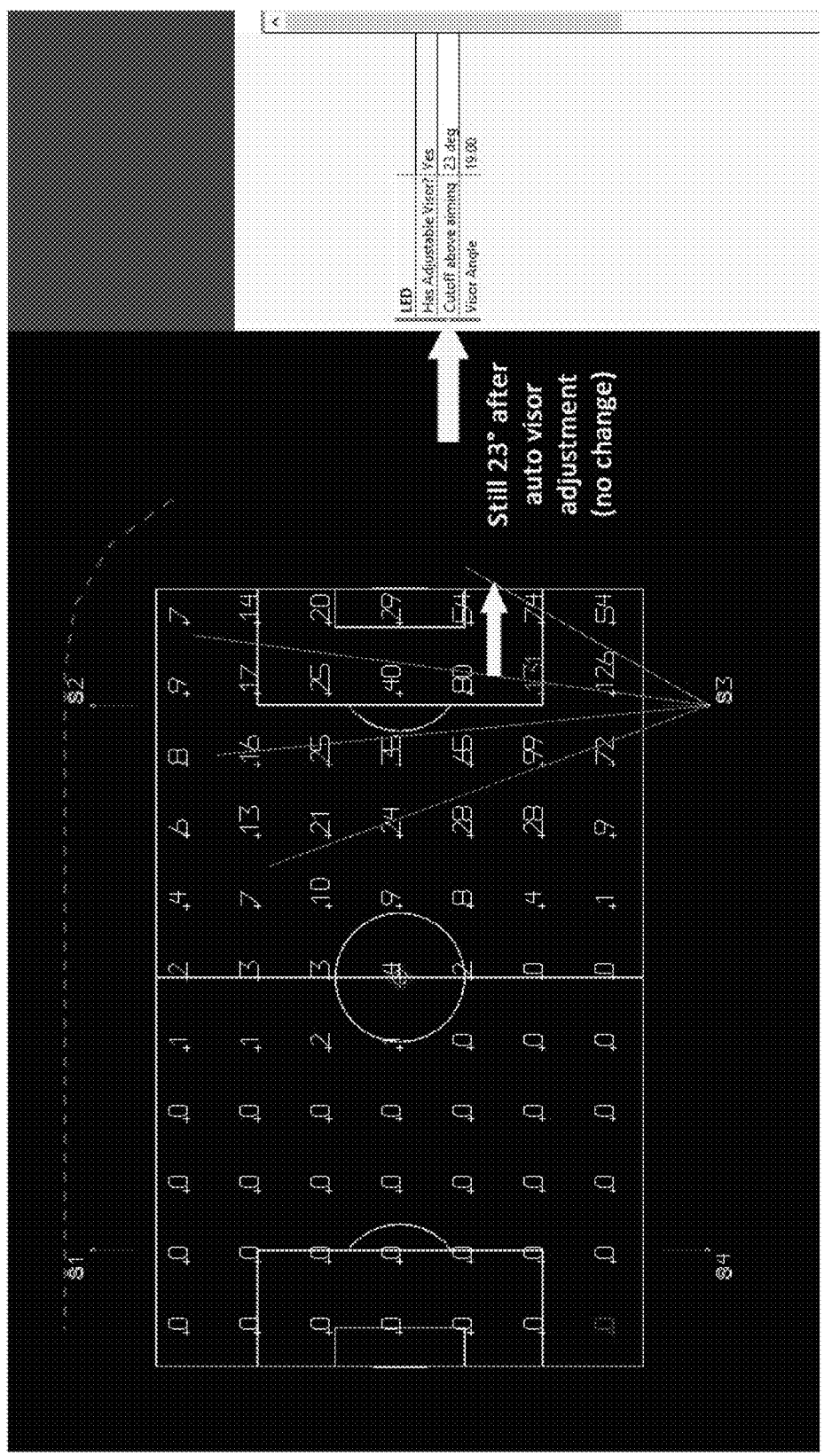

FIG. 17 illustrates a screenshot from a proprietary software program in which a virtual light source is defined, FIG. 18 illustrates a screenshot from a proprietary software program in which a glare baseline is defined, FIG. 19 illustrates an initial visor aiming angle of one of the impacted light sources of FIG. 17, FIG. 20 illustrates an initial visor aiming angle of one of the non-impacted light sources of FIG. 17, FIGS. 21 and 22 illustrate a visualization of impacted and non-impacted light sources of FIG. 17, FIG. 23 illustrates the visor aiming angle of the impacted light source of FIG. 19 after automatic re-aiming, and FIG. 24 illustrates the visor aiming angle of the non-impacted light source of FIG. 20 after automatic re-aiming.

FIG. 25 illustrates two views of a camera, armature, and tripod arrangement which permits in-field candela calculation according to at least some aspects of the present invention.

Figure 26:
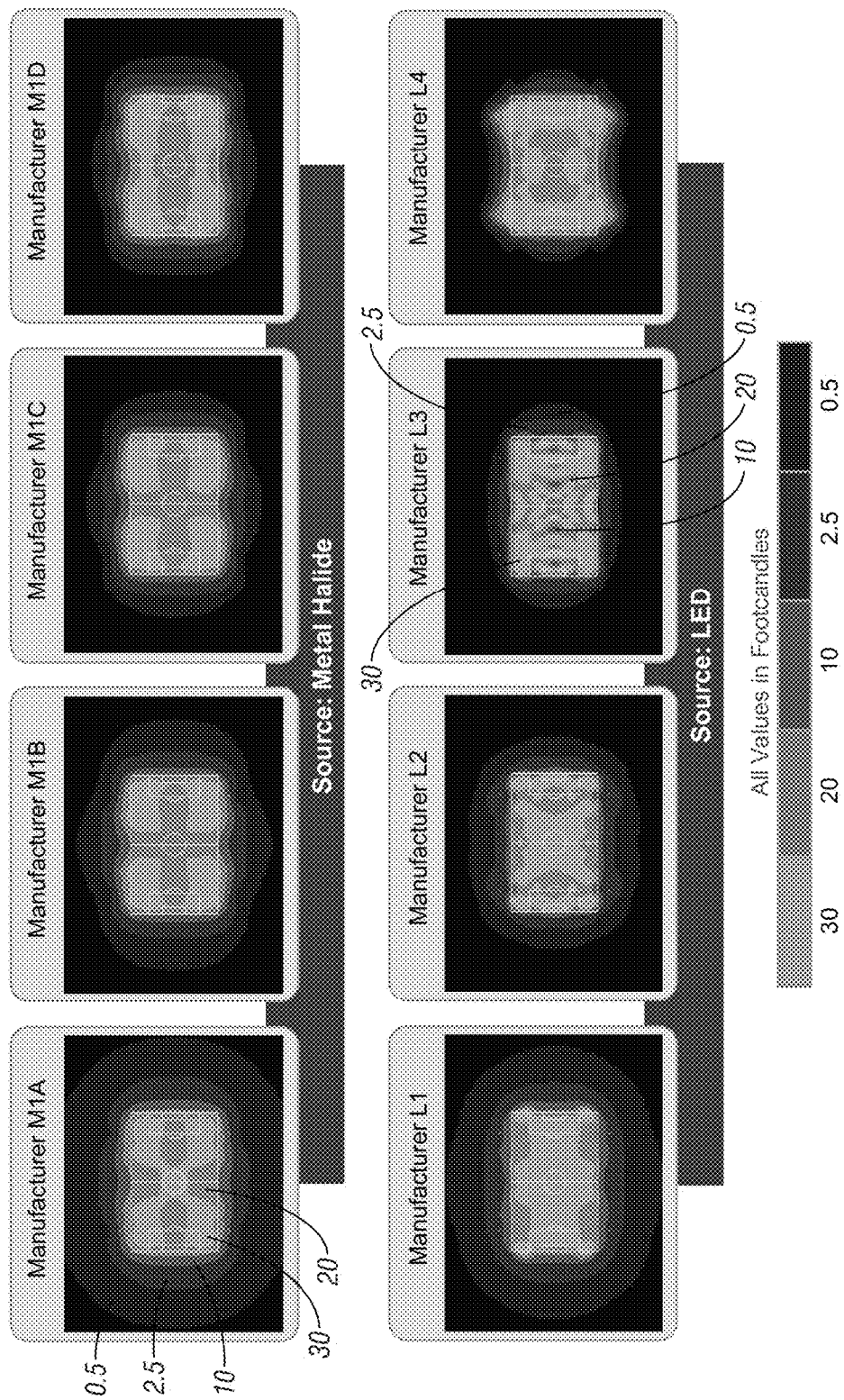
Figure 27:
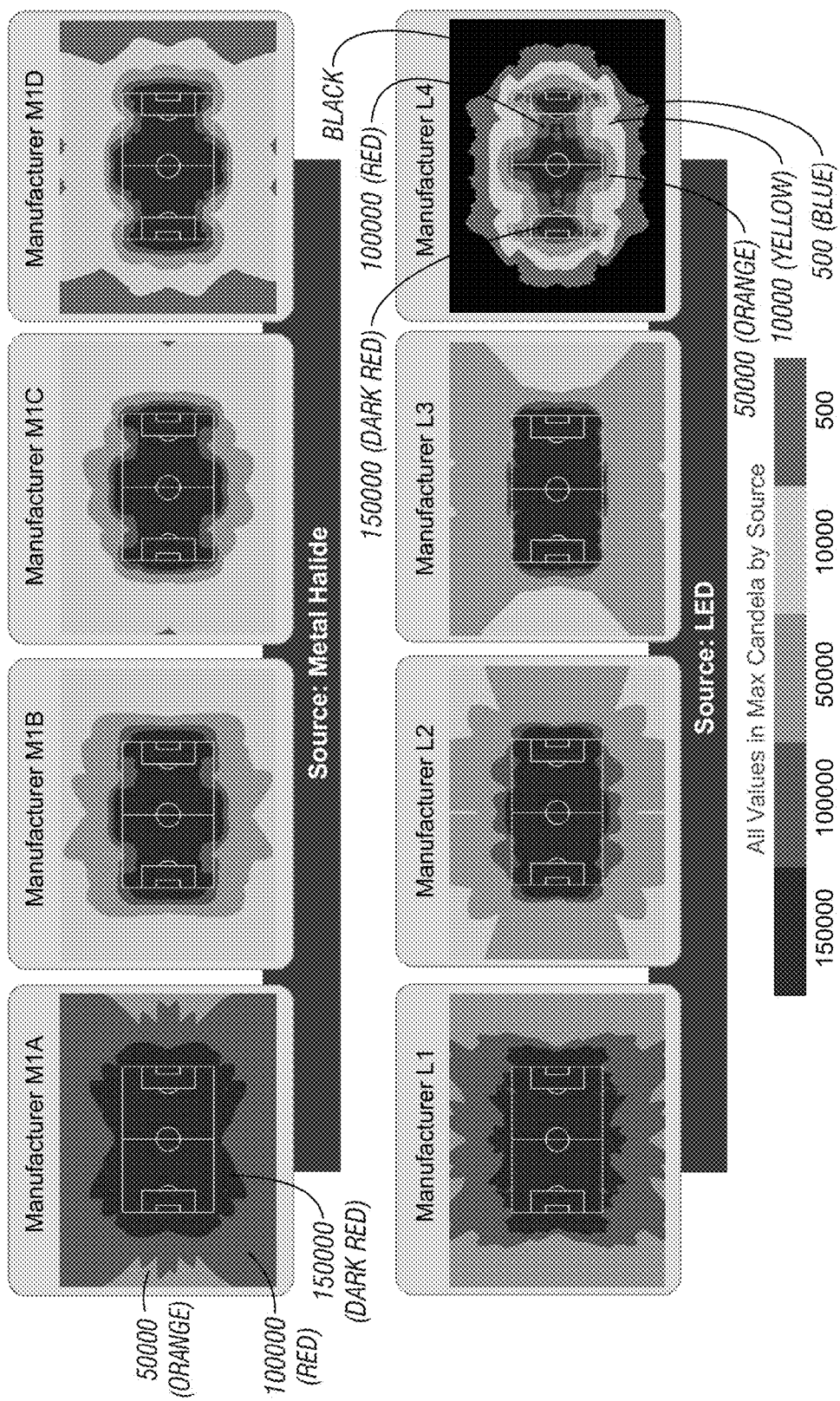

FIGS. 26 and 27 illustrate one possible means of comparing generated lighting designs according to aspects of the present invention.

FIG. 26 illustrates lighting designs evaluated in terms of horizontal illuminance and FIG. 27 illustrates lighting designs evaluated in terms of maximum candela.

Figure 28:
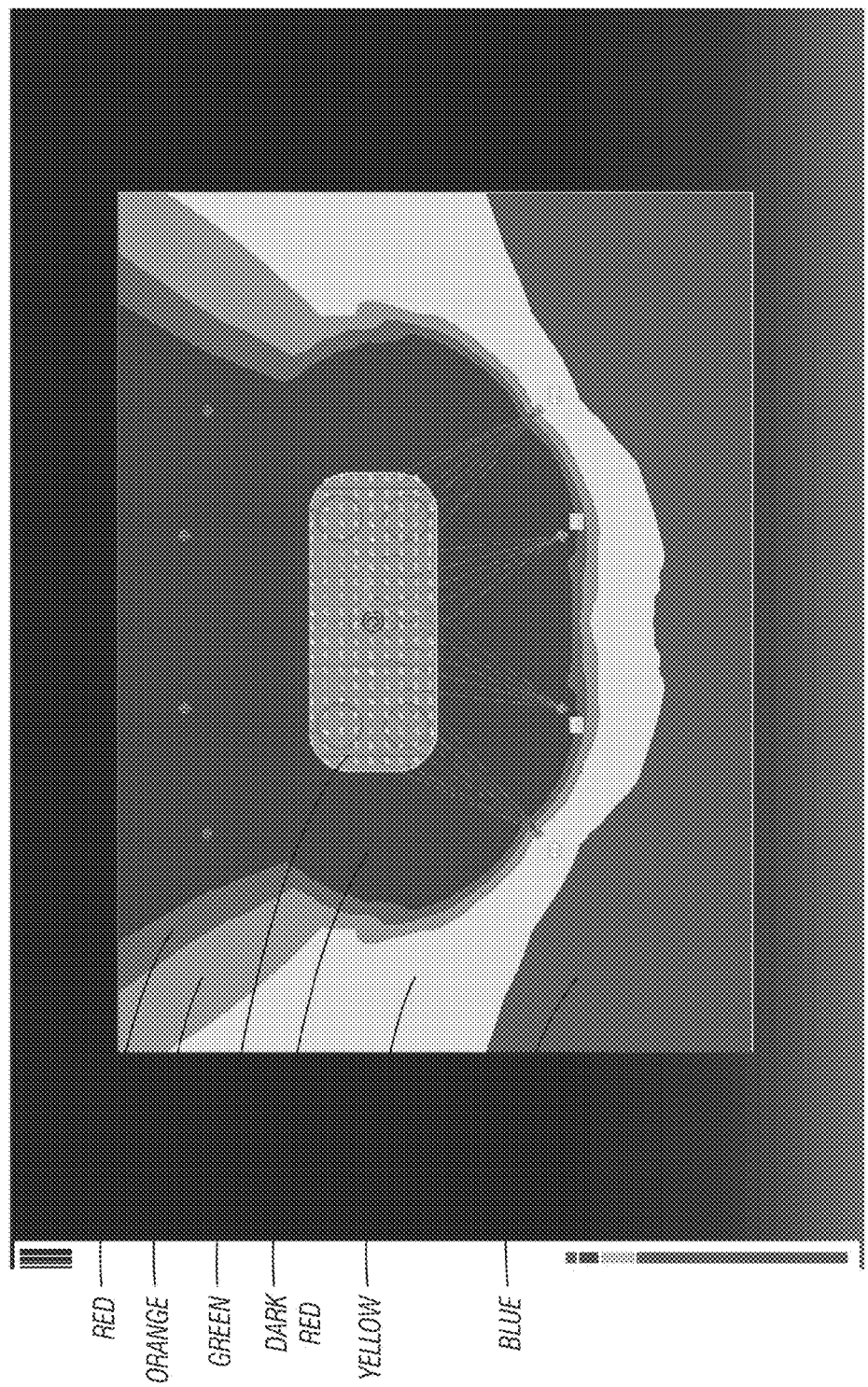

FIGS. 28 and 29 illustrate one possible means of comparing perceived glare in generated lighting designs from different lines of sight according to aspects of the present invention.

FIG. 28 illustrates a glare map evaluated in terms of maximum candela with 360° field of view at each measurement point and FIG. 29 illustrates a glare map of the same virtual lighting system as in FIG. 28 but evaluated in terms of maximum candela with 180° field of view centered on (0,0,0) from each measurement point.

V. DETAILED DESCRIPTION OF EXEMPLARY EMBODIMENTS

A. Overview

To further an understanding of the present invention, specific exemplary embodiments according to the present invention will be described in detail. Frequent mention will be made in this description to the drawings. Reference numbers will be used to indicate certain parts in the drawings. Unless otherwise stated, the same reference numbers will be used to indicate the same parts throughout the drawings.

Regarding terminology, to avoid confusion, lighting systems that are actually installed (or are manufactured for installation) are referred to herein as "existing" lighting systems, the associated lighting designs referred to as "existing" lighting designs. Lighting designs which are generated—whether photorealistic renderings such as is discussed in aforementioned U.S. Pat. No. 8,928,662 or photometric calculations such as may be produced by the aforementioned AGi32 software—are referred to herein as "virtual" lighting designs, the associated lighting systems referred to as "virtual" lighting systems. This distinction is provided merely to illustrate two possible modes of practicing aspects according to the present invention—retrofit and predictive, respectively. The invention is in no way limited to this terminology, nor to the two modes discussed herein. Further, the potential glare sources—regardless of whether a part of an existing lighting system or virtual lighting system—may be referred to as a "sub-unit", "module", "fixture", "luminaire", or "light source". While there is a general understanding in that art that a luminaire is different than, for example, a module—it is generally understood the luminaire is the full unit and one or more modules may be included in a luminaire—little, if any, specific distinction is made between the aforementioned terms. Aspects according to the present invention could be applied to a luminaire housing a single, large, high output light source, or several, small, low output light sources which combine to form one or more modules. The terms "fixture" and "luminaire" may be used interchangeably (as they often are in the art now) without any limitation put on electrical power components, light redirecting element, or light directing elements. The invention is in no way limited to this terminology, nor to any type of light source. Lastly, reference is made herein to "spectators", "users", "end users", "subjects", and "lighting designers". These terms have been used for purposes of convenience and illustration, and in no way place limitations on those whom may practice (or benefit from) aspects of the present invention.

The exemplary embodiments envision modification of existing lighting design tools so to include aspects of glare science, and in a manner that works towards the goal of lighting design; namely, adequately lighting a target area as viewed from one or more vantage points to one or more specifications for one or more situations. For example, existing tools in the industry such as imaging devices (e.g., cameras), computing devices (e.g., laptops), and means of viewing images from the imaging devices on the computing devices (e.g., commercially available live viewing software) are modified according to aspects of the present invention so to have an interactive component relating to glare perception; generally speaking, means to visually indicate when glare poses an actual problem—as based on individual perception rather than any particular glare model, though entirely adaptable to the latter. The benefits of such an approach to glare science will become apparent in the description of more specific exemplary embodiments, presently discussed.

B. Exemplary Method and Apparatus Embodiment 1

Figure 1:
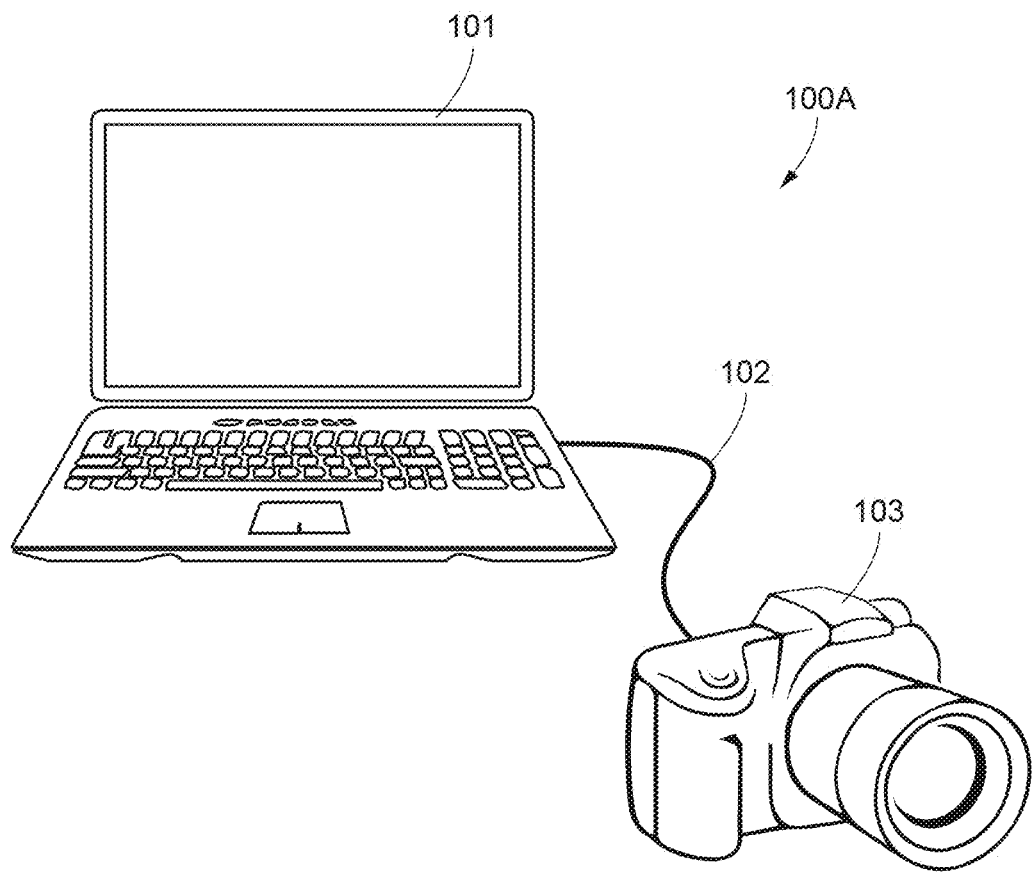
FIG. 1 illustrates one possible apparatus for employing a method 1000 according to aspects of the present invention and relying, at least in part, on existing lighting design tools.
Figure 2A:
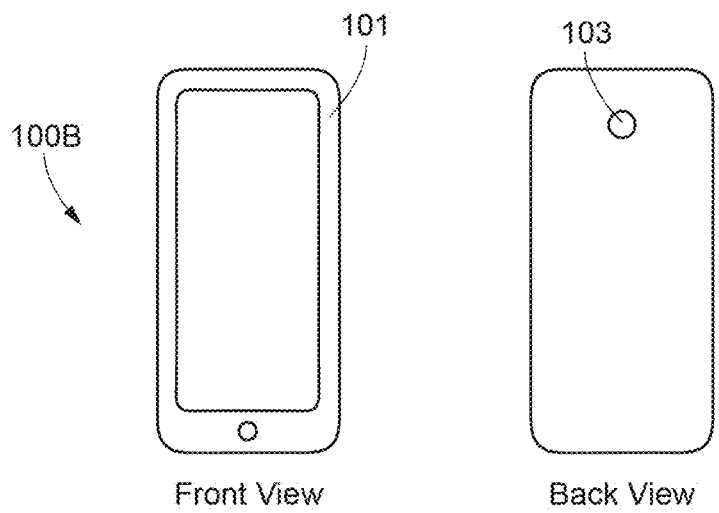
FIGS. 2A and 2B illustrate alternative apparatuses for employing a method 1000 according to aspects of the present invention and relying, at least in part, on existing lighting design tools.
Figure 2B:
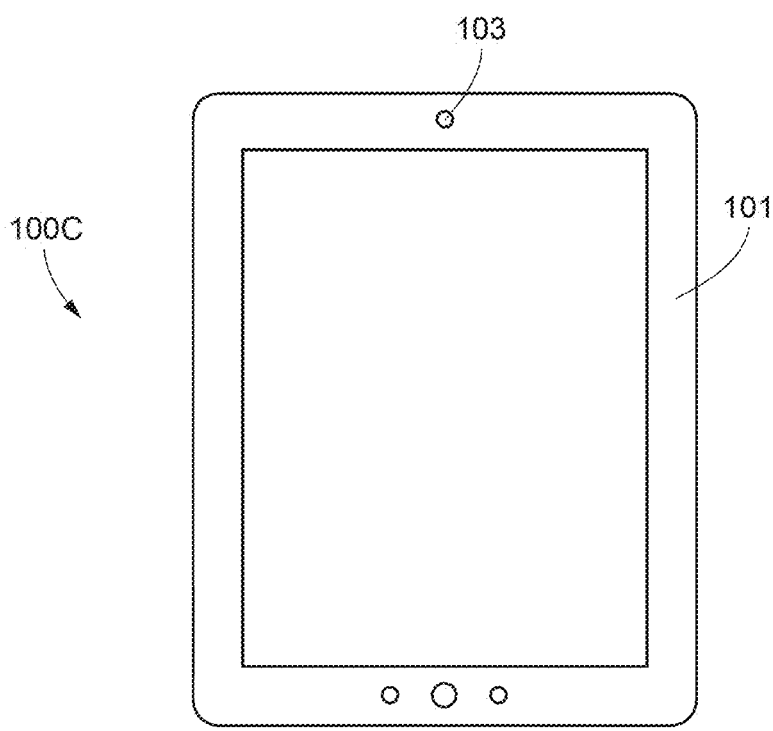

According to the present embodiment, a diagnostic apparatus at least partially including existing lighting design tools is enabled with glare visualization means and used in a retrofit mode for either an interior (e.g., FIGS. 3-7) or exterior (e.g., FIGS. 8-10) environment. Said diagnostic apparatus may be as is illustrated in FIGS. 1, 2A, 2B, or otherwise. FIG. 1 illustrates a typical example of a commercially available photographic imaging device (e.g., model EOS Rebel T3i available from Canon U.S.A. Inc., Melville, N.Y., USA), a commercially available portable computing device (e.g., any of the Latitude model laptops available from Dell Inc., Rock Round, Tex., USA), Canon's publicly available Canon Digital Camera Software Development Kit, and a software program adapted to remotely control said photographic imaging device (e.g., DSLR Remote Pro software available from Breeze Systems Ltd., Camberley, Surrey, United Kingdom). Information about the Canon Digital Camera Software Development Kit can be found at http://www.usa.canon.com/cusa/consumer/standard_display/sdk_homepage (website accessed 2014 May 25). Information about the DSLR Remote Pro software can be found at http://www.breezesys.com/DSLRRemotePro/features.htm (website accessed 2014 May 25).

As can be seen from FIG. 1, camera 103 is attached to laptop 101 via appropriate electrical/digital communication link or means 102 so to comprise a diagnostic apparatus 100A. FIG. 2A illustrates an alternative diagnostic apparatus 100B employing a smart phone-type device 101 with camera 103, and FIG. 2B illustrates a still further alternative setup 100C which employs a tablet-type device 101 with camera 103. As long as the photographic imaging device can be adjusted in terms of aperture and shutter speed (e.g., so to enable manual exposure adjustment), and as long as there are means to enable a live feed of the photographic image on the device 101, the particular components of the diagnostic apparatus of the present embodiment are at the discretion of the lighting designer or other user.

One possible method of using diagnostic apparatus 100A, 100B, or 100C to visualize glare thresholds for purposes of diagnosing or retrofitting existing lighting systems may be such as is illustrated in FIG. 11. As can be seen, method 1000 comprises a first step 1001 in which application or boundary conditions are defined; these can be photometric (e.g., minimum required light levels, adaptation level) or physical (e.g., typical lines of sight, three-dimensional space for area of play), for example. A second step 1002 comprises defining a glare threshold which makes practical sense given the information in step 1001. For example, knowing a typical eye adaptation from step 1001 will inform the value of a glare threshold according to step 1002, regardless of whether the glare threshold is defined in terms of luminous intensity (cd), luminous flux (lm), or some other metric supported by glare science. A third step 1003 comprises creating a visualization of the threshold defined in step 1002. As envisioned, this visualization will manifest differently for retrofit mode (discussed in the present embodiment) and predictive mode (discussed in Embodiment 2). An optional fourth step 1004 comprises real-time evaluation of the visually indicated glare threshold; again, this manifests differently for retrofit mode and predictive mode, and is discussed in greater detail in accordance with the present embodiments.

As a specific example, consider now an indoor office space with traditional drop ceiling and recessed fluorescent lighting. Even though a user's line of sight is typically directed downward (e.g., towards a computer monitor or desk), for illustrative purposes a worst case scenario (i.e., looking directly upward at a light) is assumed for application of method 1000 according to the present embodiment. By assuming a worst case scenario, any consideration of which glare metric/model is most relevant, how additivity (see again the aforementioned Clear paper) impacts glare based on vantage point, and the like can be completely avoided and the overall glare analysis process greatly simplified; though, of course, method 1000 could be adapted to include such considerations.

FIG. 3 illustrates a first screen from a proprietary software installed on laptop 101 (FIG. 1) and used in conjunction with digital camera 103 and remote control software (discussed above). According to method 1000, a first step 1001 comprises defining the application and/or boundary conditions. Firstly, a user may select a glare baseline 2000; in this example, by selecting "Interior". Selecting a glare baseline sets an aperture and shutter speed for the camera based on a predefined adaptation luminance for the interior application area (i.e., target area). Each selectable glare baseline 2000 has a separate exposure for the camera (e.g., an aperture value of 13 and shutter speed $\frac{1}{400}$ s of for the "Interior" setting); this sets a particular dynamic range which (i) avoids the need for time-consuming calculation of the adaptation luminance via high-dynamic-range imaging (HDRI) and (ii) sets a luminous boundary beyond which any additional luminance will automatically be considered glare. Additional details regarding the calculation of adaptation luminance (i.e., background luminance), and an example of glare analysis using HDRI, is later discussed. Having selected a glare baseline, the application area is defined by simply enabling the live view (see reference no. 2001, FIG. 4) and aiming said camera towards an area; in this example, the worst case scenario of looking directly at the recessed fluorescent lighting fixture, though the worst case scenario could differ for different lighting applications.

According to step 1002 a glare threshold is defined. As is well known in the art, glare is not a single value for all conditions, and so as envisioned it is possible to define a variety of thresholds; in this example, a lower threshold (i.e., discomfort) and an upper threshold (i.e., disability) which are defined based on luminance values recorded by the camera (see reference no. 2002, FIG. 4). Measured in candela per square meter ($cd/m^2$), luminance is the closest measurable quantity to a person's perception of brightness, and so makes practical sense since the present embodiment is directed to a person evaluating a potential glare source already in existence; though, of course, a glare threshold could be defined in other ways (e.g., luminous intensity). Setting two threshold values also makes practical sense because in the present embodiment the glare source is already in existence and a user can—in real time—evaluate perceived glare. This functionality lends itself to a fine degree of control and good resolution in the process of quantifying what is a subjective experience. In this particular example, the lower threshold is set at 530 $cd/m^2$ and the upper threshold is set at 16,928 $cd/m^2$; these are based, respectively, on the "rule of thumb" for direct glare defined in the IESNA Lighting Handbook $9^{th}$ addition and the Unified Glare Rating metric to calculate a disability glare luminance. Of course, the threshold levels and the exposure settings may differ, and can be refined as greater insight into glare science is achieved.

According to step 1003 of method 1000, a glare threshold is visually indicated; this is illustrated in FIGS. 5-7. In a default state (FIG. 5) selecting a glare threshold visualization checkbox 2003 overlays a color coding on the live view where the coloration of each pixel depends on how the measured luminance (by the camera) at that pixel compares against the thresholds defined according to step 1002 (taking into account slider position 2004 (FIG. 6)); see aforementioned U.S. Pat. No. 8,928,662 for additional details regarding the overlaying of a color layer on a live image. As can be seen from the lower left corner of FIG. 5, the default color coding is red for disability glare, orange for discomfort glare, and yellow for what is possible (i.e., possibly acceptable but possibly unacceptable under some conditions). In practice, when the "show glare" option is enabled (see checkbox 2003) and the live view is overlaid with a color coding corresponding to the different thresholds (the different thresholds corresponding to different luminance values), the camera may be moved about a space so to provide real-time evaluation of the color coding—and therefore, perceived glare—of any light source in the area. This, in essence, predicts whether or not a light source in a line of sight will be a glare source, as based on a specified adaptation level and indicated by color coding on a video feed.

Consider, though, the situation in which a subject (e.g., an office worker A) disagrees with the color coding. Rather than determine why subject A's perception of glare differs from the default setting, or re-evaluating a glare metric, or questioning the very validity of any particular glare model, the lighting designer may simply adjust the thresholds so that the color coding matches the individual's perception of glare. FIG. 5 has the slider on the right at a setting intermediate between "+" and "−" extremes for the live image of FIG. 4. FIG. 6 has the slider to the "+" extreme, while FIG. 7 to the "−" extreme for the same live image as FIG. 4. In this example, there are three glare thresholds involved. The disability glare threshold is the highest threshold; i.e., a pixel will be color coded red for the highest sub-range of luminance values measured by the camera (i.e., values above a disability glare threshold), as disability glare can be considered a more severe issue than discomfort glare. Discomfort glare coloring orange is applied to pixels measuring luminance at a sub-range of lower values (i.e., values above a discomfort glare threshold and up to the disability glare threshold). Yellow coloring of a pixel is a still lower sub-range of values (e.g., any measured luminance up to the discomfort threshold). Therefore, regardless of where the slider is on the right side of the screen shown in FIGS. 6 and 7, if a pixel is color coded red, it indicates it is in the highest sub-range of measured luminance values and has the most severe (disability) glare concern, orange indicates the less severe discomfort glare issue, and yellow indicates a still less severe glare issue which may or may not be an actual problem (e.g., may or may not be displeasing, may or may not be perceivable, etc.). However, the right side slider allows flexibility in adjusting the relative percentages of the image overlay which are colored red, orange, and yellow—by adjusting the three thresholds.

So for example, in FIG. 6 a slider 2004 has been moved toward the plus ("+") symbol—via mouse or other manually operated member—to provide a visual cue that the image should have more "red"; in essence, lowering the threshold for disability glare so more of the glare source appears red and, therefore, appears to be a disabling glare source (note how nearly the entire colored area in FIG. 6 appears red). Alternatively, the spectator may think a glare source is uncomfortable, yet tolerable. In this alternative example (FIG. 7), the lighting designer or spectator could adjust slider 2004 down towards the minus ("−") symbol—again via mouse or other manually operated member—to provide a visual cue that the image should have more "orange"; in essence, increasing the threshold for disability glare so more of the glare source appears orange and, therefore, appears to be a discomfort glare source (note how very little of the colored area in FIG. 7 appears red—more appears orange). If desired, the lower glare threshold (i.e., the dividing line between yellow and orange) could be adjusted in kind, or separately.

The real-time adjustment of glare thresholds (see FIGS. 5-7) could certainly satisfy optional step 1004 of method 1000, but a lighting designer could further walk about the target area and test different vantage points or light sources to determine additional glare sources, verify the worst case scenario has been identified, or for other reasons.

So it can be seen that with some modification to existing lighting design tools perceived glare can be readily visualized according to method 1000 and potential glare sources identified without requiring adherence to any particular glare metric/model, but the underlying methodology entirely adaptable to any particular glare metric/model, if desired. Further, because method 1000 can be applied to a portable lighting design tool, a lighting designer is better equipped to work with a user or spectator to identify glare sources in existing lighting systems so to aid the user in adjusting operating conditions (e.g., electrical operating current to the light sources), or in identifying retrofit options (e.g., as a sales tool), for example.

As another specific example, consider now an outdoor space which includes one or more elevated lighting fixtures designed to provide directional (i.e., task) lighting in a generally downward fashion; FIGS. 8-9 and 10 illustrate two possible examples (a skate park and soccer field, respectively). Unlike the indoor environment just discussed, in this outdoor sports environment there are multiple typical lines of sight, multiple background luminance levels (depending on the time of day), and multiple potential glare sources. In essence, the number and location of glare sources can vary depending on the position and viewing angle of a spectator, aiming angle of a lighting fixture, time of day, season, and the like. As such, more than one approach to visualizing glare, identifying glare sources, and enhancing an understanding of the human experience as it relates to glare may be required to operate a diagnostic apparatus such as 100A-C (FIGS. 1, 2A, and 2B) in a retrofit mode.

A first approach could proceed similarly to that already discussed for method 1000 and illustrated FIGS. 3-7. In this example, according to step 1001 a user would select "Night: Sports" as baseline 2000 (FIG. 3). As stated, selecting a glare baseline sets an exposure for the camera based on a predefined adaptation luminance for the application area; in this example an aperture value of 13 and shutter speed of $\frac{1}{750}$ s for a "Night: Sports" setting. Steps 1002-1004 of method 1000 may proceed accordingly using the live view feature, which would permit a lighting designer to provide real-time evaluation of potential glare sources of the already existing lighting system. A lighting designer could walk around the skate park of FIGS. 8 and 9, for example, and document the day, time, general environmental conditions (e.g., night, overcast), and luminances for a number of positions, viewing angles, and potential glare sources. A spectator could modify sliders 2004 of the colored overlay (FIGS. 5-7) so to produce a color coding that matched his/her perception of glare. If desired, his/her preferred slider settings could be saved and recalled at a later date (e.g., when again evaluating the lighting system under different environmental conditions).

Sometimes, though, live viewing is not a practical option. For example, if a lighting designer wants to evaluate a potential glare source at a particular time of day, during a particular event, or present results to a user at a later time, it may be beneficial to capture images instead of live viewing a target area. As such, a modified approach to method 1000 is as follows.

In this example, according to step 1001 a lighting designer or other user still defines the application and/or boundary conditions, but instead of a live view a lighting designer may opt to create a high-dynamic-range image by taking multiple photographs using camera 103 (FIG. 1) at the same position but at different exposures (i.e., different shutter speeds at a single aperture setting) so to capture a different range of luminances (see FIG. 8). The images may then be blended such that the clipped luminances (i.e., those which are beyond the measurement of the luminance sensor inherent to the camera) which are produced at long exposure times and the loss of background luminance (i.e., those which are below the measurement of the luminance sensor inherent to the camera) which are lost at short exposure times are used as points for normalizing the images to create a composite image which more accurately represents the relative luminances the human eye sees. This blending process is well known in the art of photography and many smart phone-type and tablet-type apparatuses (101B, FIG. 2A and 100C, FIG. 2B, respectively) already possess the ability to produce a high-dynamic-range image such at that illustrated in FIG. 9.

According to step 1002 one or more glare thresholds can be defined. As envisioned, a tripod and associated extending armature can be used to mount camera 103 at a number of positions; one possible apparatus is illustrated in FIG. 25. At a first position, a number of exposures can be used to produce the high-dynamic-range image. Camera 103 may then be moved to a different position along the extending armature and away from the first position, and another photograph (i.e., a reference photograph) taken at a single exposure. If desired, this can be done multiple times at intermediate and distal positions along the extending armature so to create, in essence, a stereoscopic imaging series.

Knowing the precise location of the camera positions, and knowing the height of each light source (i.e., pole height), the lighting designer may—using well known principles—calculate the distance from the first position to the light source. Knowing the distance, and knowing the luminance from step 1001, luminous intensity (cd) can be derived. In addition to being very useful information for the second mode of operation—predictive mode (later discussed)—the maximum candela (i.e., luminous intensity) may also inform the threshold(s) set according to step 1002. As has been stated, the thresholds could be based on IESNA Lighting Handbook 9$^{th}$ addition, the Unified Glare Rating metric, or even other areas which inform glare science; see, for example, TP-108-13 (a publicly viewable report by the U.S. Department of Transportation) which provides maximum candela value recommendations for directly viewable headlamps, or DOT HS 810 947 (a publicly viewable report by the National Highway Traffic Safety Administration of the Department of Transportation) that evaluates headlamp glare using De Boer ratings. Step 1003 of method 1000 may proceed similarly to that already discussed.

As another alternative to live viewing, a high-dynamic-range image can be produced within existing lighting design software. Often, manufacturers will provide not only a host of photometric data associated with a product, but physical dimensions and other information as well. This information can be used in existing lighting design software to model a lighting system. An example of high-dynamic-range images formed entirely from modeled lighting systems is illustrated in FIG. 10, though it should be noted that the images and values reported in FIG. 10 are merely intended to illustrate one possible way to visually represent glare perception, and are not intended to promote or disparage any particular approach to lighting design. As can be seen from the values reported, the Unified Glare Rating (UGR) model was used to develop the thresholds according to step 1002 (FIG. 11). The background luminance was calculated by removing the virtual lighting fixtures and averaging the scene luminance along the specified line of sight in accordance with the UGR model, though other glare metrics/models or insights into glare science could inform the glare threshold(s), and different lines of sight could be modeled.

FIG. 10 highlights a benefit of using high-dynamic-range images instead of live viewing in accordance with method 1000; namely, a lighting designer can ensure the conditions are the same across manufacturers so to provide a balanced comparison. For example, in each instance illustrated the virtual lighting system was designed to light a typical soccer field to 30 horizontal fc, the image of each field generated at 262 feet away from the center of the field along the midline at 0° tilt. As another benefit, each virtual lighting system in FIG. 10 could be modeled so to reflect the precise conditions of an actual lighting system. Instead of comparing lighting systems between manufacturers, a lighting designer or other user could compare the modeled system to what was guaranteed during a bid, for example. In this sense a diagnostic apparatus according to aspects of the present invention would still enable glare visualization means, and in a retrofit mode. For example, a user may purchase a lighting system that fully adheres to UGR/GR ratings for a particular sport or in accordance with a particular governing body, but that user may still perceive glare from the system. According to the present embodiment, glare thresholds could be refined such that the modeled system presents a visualization of what the user experiences, regardless of whether the actual lighting system meets its specification—this presents opportunity for refinement of the actual system, or identification of replacement products, for example.

In this example, the program colorizes the images of the light fixtures (or part portions thereof) according to the colored index bar below each image (which, from left to right), assigns dark blue to "unnoticeable" glare, light blue to green-yellow for "possible glare"; yellow to orange for "discomfort" glare; and red to dark red for "disability" glare. The results in FIG. 10 are:

Manufacturer L1 (two rows of four fixtures on a single pole): the center two fixtures in top and bottom rows are colored red indicating disability glare.

Manufacturer L2 (top row of four fixtures; bottom row of three): the second from left fixture in top row and middle fixture in bottom row are red for disability glare. All others are yellow for discomfort or possible glare (some have portions orange for discomfort glare).

Manufacturer L3 (top row of five fixtures; bottom row of four fixtures): second and third from left in top row are red; as is third from left in bottom row. Two outside on top row are blue for unnoticeable glare.

Manufacturer L4 (plural fixtures in three rows): none have red, orange, or yellow.

That being said, existing lighting design software is also a suitable platform for practicing aspects of the present invention in a predictive mode, an embodiment of which is presently discussed.

C. Exemplary Method and Apparatus Embodiment 2

An alternative embodiment in accordance with at least some aspects of the present invention still relies upon method 1000 of FIG. 11 so to produce a visual indication of perceived glare—specifically a glare threshold—but approaches glare perception and the role of glare science as it relates to lighting design from a predictive standpoint. Rather than a diagnostic apparatus such as 100A-C (see FIGS. 1-2B), the present embodiment makes use of lighting design software such as the aforementioned AGi32 software as the existing lighting design tool—because the present embodiment is directed primarily to virtual lighting designs and systems; i.e., those which have not yet been manufactured. An overview of the AGi32 software is incorporated by reference herein and available online at http://lrt.sagepub-.com/content/45/2/141.full.pdf+html (website accessed 2014 May 25), though it is of note that the following figures illustrate images from a proprietary software with similar functionality as AGi32 software, as modified to incorporate glare visualization means according to aspects of the present invention.

As a specific example, consider now a lighting design for a tennis court such as is illustrated in FIG. 12. As is well known in the art, any such lighting design must adhere to any requirements or restrictions imposed by municipalities, relevant ordinances, or the sports' governing body. As an example, the four-pole layout illustrated (reference nos. T1-T4) is one of three outdoor court pole layouts deemed acceptable by the International Tennis Federation; see, e.g., lighting guidelines posted on http://www.itftennis.com/technical/facilities/facilities-guide/lighting.aspx, (website accessed 2014 May 7), which are incorporated by reference herein. Of those various requirements/restrictions, the most relevant to the present discussion are those which relate to unwanted light; namely, spill light and glare. In FIG. 12 the court is shown by gray lines inside the blue rectangle having virtual "+" symbols on its perimeter. A larger gray rectangle is outside the blue rectangle and inside a still larger gray rectangle. These outer rectangles mark other boundaries related to the court. These gray and blue lines will be repeated in subsequent figures as is appropriate with respect to discussion or spill light and glare.

There already exist tools to indicate spill light on a lighting diagram, spill light generally defined as light that falls outside the intended target area in any plane or dimension and, therefore, is wasted. FIGS. 13A and B illustrate a spill light threshold for the conditions listed in Table 1 where the threshold is visually indicated by a line measured approximately 150 feet from the court in all directions (in the plane of the court surface), and where spill light is reported in terms of the vertical footcandles (fc) at said line as determined by photometric characterization of the selected luminaire (e.g., as provided from a lighting manufacturer or empirical testing).

TABLE 1

Spill Line (FIGS. 13A and B)

| | Light Source | # Light Sources/ Pole (T1-T4) | Mounting Height (ft) | Aiming Angle | Horizontal fc (avg) | Target horizontal fc (avg) |
|---|---|---|---|---|---|---|
| FIG. 13A | 1500 W HID lamp | 2 | 40 | 25° | 79 | 50 |
| FIG. 13B | XM-L LED* | 384 | 40 | 25° | 63 | 50 |

^ as measured down from horizon - not including visor cutoff
* available from Cree, Inc., Durham, NC, USA In practice, one can look at the spill lines (large white "0" shape) of FIG. 13A and compare the maximum shown in green (i.e., 0.35 fc at the 12 o'clock position) and minimum shown in red (i.e., 0.13 fc at approximately the 11 o'clock position) to any of the aforementioned requirements/restrictions to confirm compliance; note there is virtually no spill light in FIG. 13B due to the precisely controlled light distribution inherent to wide area LED fixture design (see again co-pending and incorporated by reference U.S. patent application Ser. No. 13/897,979 (US2013/0250556)).

According to aspects of the present invention, a similar approach can be employed to visually indicate a glare threshold. Looking at method 1000 of FIG. 11, a first step (1001) comprises identifying the lighting application and/or boundary conditions. For the specific example of the tennis court in FIGS. 13A and B it is logical to assume that a player on the court has a different line of sight (e.g., near the center of the court at the top of the net) and a different adaptation level (e.g., due to different ambient conditions such as an increased adaptation luminance or field of view) than a spectator many feet away. It is not necessary to understand precisely which lines of sight are typical or most critical, nor is it necessary to understand how adaptation affects glare perception, nor is it necessary to identify all the possible ways in which a viewer on the court and off the court differ; at this stage in the methodology, one need only to be able to identify areas which may have different needs for indicating glare based on a basic understanding of glare science. There are a number of ways in which the application area of FIGS. 13A and B could be sliced up and considered, but for simplicity—and because such a division is already widely recognized in the lighting industry and part of the collective vocabulary—the application areas of FIGS. 13A and B will be considered in terms of off site and on site, discussion directed to the visual indication of offsite glare and onsite glare, respectively.

Consider first offsite glare where, for simplicity, "off site" will be considered anywhere at or beyond the defined distance for spill light measurements; in this example, 150 feet from the perimeter of the tennis court in all directions. In practice, one could consider a variety of locations to be "off site" depending on where the court is (e.g., a residential area versus isolated location), how many other lighted areas exist at the site (e.g., so to take into account eye adaptation), existing guidelines (see, e.g., Federation Internationale de Football Association (FIFA) guidelines which define distances relative the stadium perimeter rather than a field perimeter), and the like. That being said, it makes some practical sense to define off site as the same spill line location because this distance has already been mapped out in existing lighting design tools and, therefore, achieves the objective of integrating glare analysis into already existing lighting design tools. Regardless, though, of where "off site" is, method 1000 proceeds accordingly.

According to step 1002 a glare threshold is defined. Much like the spill light lines of FIGS. 13A and B a glare line could be defined according to various restrictions or requirements by municipalities, ordinances, governing bodies, and the like; however, unlike spill light, glare is not well understood, not many agree on a particular metric or model, and fewer still have an understanding of when glare poses an actual problem (see again the aforementioned and incorporated by reference, Clear et al. paper). So lacking clear direction from the industry, and yet providing a path for refining visual indication of glare thresholds as greater insight into glare science is achieved or new lighting design tools are developed, according to the present embodiment a glare threshold is defined in terms of luminous intensity (i.e., candela (cd)). Luminous intensity makes practical sense for use as a glare threshold because it is (i) readily produced in existing lighting design software and (ii) the most basic photometric property and the basis for nearly all metrics used in existing glare models; though, of course, a glare threshold could be defined in other ways (e.g., luminance).

In terms of the actual threshold value, a similar approach could be taken as that in Embodiment 1. A first threshold could visually indicate the potential for one or more glare sources to cause discomfort glare and a second threshold could visually indicate the potential for one or more glare sources to cause disability glare; again, both terms well known in glare science. Two or more glare lines could be overlaid on the lighting design image and color coded to indicate the respective thresholds; see, e.g., the spectrum of color coding of FIG. 10. For simplicity, though, the present embodiment sets a single threshold at 500 cd. State-of-the-art photometric testing of light sources—so-called dark current or stray light testing, in particular—demonstrates an error (i.e., phantom light readings not indicative of actual light source performance) of roughly 1% maximum luminous intensity (cd). Thus, a threshold of 500 cd is high enough to prevent false labeling of light sources as causing glare based on photometric characterization of the source. Of course, any source which produces light could be a glare source, depending on a number of conditions (viewing angle, source size, adaptivity level). As such, empirical testing of LED luminaires was conducted in-house to determine when glare becomes an actual problem. This testing of LED luminaires revealed two things: there is an abrupt change between a "no glare" condition and a "yes glare" condition, and 500 cd is a reasonable threshold for capturing this change in condition. Since other traditional light sources (HIDs, fluorescents) have been found to demonstrate a slower transition from a "no glare" condition to a "yes glare"

condition under the same testing conditions—perhaps due to increased source size, though it is not required to know precisely why to practice the invention—it makes practical sense to design for the worst case scenario and set 500 cd as the glare threshold condition. Doing so (i) permits flexibility in adjusting the threshold as additional insight into glare science is achieved and (ii) is reasonable for a variety of light sources and luminaire designs, and so is adequate for purposes of the present embodiment.

According to step 1003 of method 1000 (FIG. 11) a visual indication of the glare threshold determined in step 1002 (i.e., 500 cd) can be displayed for the application and/or boundary conditions determined in step 1001 (i.e., anywhere beyond the spill light line). So in this example, a new line (shown in broken yellow outside of the spill line) is overlaid on both FIGS. 13A and B (see FIGS. 14A and B, respectively), the line visually indicating where candela values (as determined by existing photometry for the respective light sources listed in Table 1) meet or exceed 500 cd at any point beyond the spill line. Thus, anyone standing in the pink cross-hatched area between the spill line and the glare line (see FIGS. 15A and B) may experience glare as it was defined according to step 1002. Naturally, there may also be glare concerns in the area between the spill line and the tennis court (shown in black and indicated with an arrow in FIGS. 15A and B) but since this area was not identified in step 1001, there is no such visual indication. If desired, method 1000 could be applied a second time to this same lighting design but instead defining the application area (step 1001) as said black annular area and perhaps defining a new glare threshold (step 1002); the results could be visually indicated on the same virtual image, if desired. Thus, a single image could be rendered with two hatched "glare zones" based on different boundary conditions/application areas and potentially two different glare thresholds.

As a final and optional step (1004), a user can, in real time, evaluate a lighting design based on the visually indicated glare line threshold. Said user may manipulate boundary conditions (i.e., redefine "off site"), tweak threshold values for different lighting systems, or even re-aim the virtual lighting fixture(s) mounted on poles T1-T4 so to attempt to minimize the "yes glare" zones. Re-aiming of virtual light sources so to minimize what is predicted to be perceived glare in accordance with method 1000 is discussed for both a manual re-aiming and automatic re-aiming situation; the former is discussed first.

FIGS. 16A and B illustrate one possible scenario in which method 1000 has been applied in combination with existing lighting design tools (e.g., aforementioned AGi32 software) and operated in a predictive mode—specifically, for an onsite glare scenario. According to step 1001 "on site" is defined as anywhere within the largest generally gray rectangle having an apex or corner nearest each pole location T1-T4. According to step 1002 a glare threshold is defined; in this example as some candela value beyond which glare would likely be perceived, and which exists within the boundaries defined in step 1001 (i.e., the yellow dashed line). In practice, the actual candela value used for the glare threshold would likely much higher than 500 cd because of multiple lines of sight, multiple light sources in a field of view, increased adaptation luminance, etc., though the exact value is not important for purposes of illustrating fixture re-aiming. According to step 1003 each luminaire's beam angle is compared against the glare line threshold to determine the glare zone to be visually indicated; in this example, any portion of any fixture's beam angle (i.e., 50% maximum candela curve) which (i) falls outside of the dotted yellow glare line, (ii) is inside the outermost gray rectangular area of the court, and (iii) exceeds some luminous intensity (cd). Any part of a fixture's beam angle which does not satisfy all of (i)-(iii) is either left unshaded or shaded red in FIGS. 16A and B (see annotation "This area not evaluated for glare"). As can be seen in FIGS. 16A and B, a lighting designer can manually shift the aiming angle of a fixture at a mounting location so to minimize the glare zone (i.e., the area shaded blue and annotated "area of glare"). As is common in lighting design software, each luminaire on each pole has an aiming axis (i.e., the orange lines projecting from mounting location T2 in FIGS. 16A and B), each aiming axis dictating, at least in part, how the light from each associated light source is distributed. In practice, re-aiming a virtual fixture comprises moving (e.g., via keyboard input or via manually operated member) the orange line relative the virtual target area.

An automatic re-aiming situation is illustrated in FIGS. 17-24. In this example, entire virtual fixtures are not re-aimed manually by a lighting designer or other user; rather, only the independently pivotable visor components (i.e., light redirecting devices) such as are described in aforementioned incorporated by reference U.S. patent application Ser. No. 13/897,979 (US2013/0250556) are, and automatically in accordance with an understanding of glare science, physical limitations of the actual lighting product, user defined thresholds, standards or regulations specific to the lighting application for which the virtual system is being designed, or the like. Method 1000 proceeds as has already been described; the area of interest is generally a soccer field (step 1001, FIG. 17), a glare line threshold manually drawn (step 1002, FIG. 18) (see line above pole locations S1 and S2 and then curving down at right side). For brevity, only a single pole location S3 with four light sources (indicated by four radiating blue lines in FIG. 18) is active for purposes of illustrating step 1003. In a first state beam cutoff angles of 13° and 23° are identified for two of the fixtures at pole location S3 (see heavy yellow arrows in FIGS. 19 and 20, respectively). Assume that for some reason during the course of developing the virtual lighting design three of the fixtures at pole location S3 are projected somewhat away from the target area at some non-standard aiming angle (for example, if restrictions to mounting height necessitated a different aiming angle so to illuminate a swath of field to a particular minimum horizontal illuminance); this is illustrated in FIG. 21. As is known from incorporated by reference U.S. patent application Ser. No. 13/897,979 (US2013/0250556) re-aiming the external visor can cause a shift of the maximum intensity—or not, depending on the optical properties of the visor—and provides a distinct cutoff at some angle. According to step 1003 these three fixtures would be considered for auto-visor re-aiming; a visual indication of what is predicted to cause perceived glare shown as a yellow ellipse around the three left-most red aiming lines from pole S3 (also bolded or otherwise made heavy to stand out). FIG. 22 shows the remaining fixture at mounting location S3—a fixture which will be unaffected by the auto-visor re-aiming because it is not in violation of the glare threshold determined according to method 1000. In practice, the manually drawn glare line indicates to the lighting design software program that any virtual lighting fixture projecting light which crosses said line at its specified virtual mounting location and aiming relative the virtual target area must be re-aimed until no light (as determined by the photometry inputted into the software) crosses the glare line, thereby defining a new cutoff angle. Indeed, as can be seen from FIGS. 23 and 24, the affected fixture from FIG. 19 has had its visor re-aimed so to modify the beam cutoff angle (7° in FIG. 23 versus 13° in FIG. 19) whereas the unaffected fixture in FIG. 24 has not had its visor aiming angle modified and, therefore, the beam cutoff angle is not affected (i.e., at 23° in both FIGS. 20 and 24).

The automatic re-aiming feature illustrated in FIGS. 17-24 highlight another benefit of the invention; namely, that aspects according to the present invention are entirely adaptable to lighting systems—virtual or existing—of varying complexity. Whereas in FIGS. 15A and B glare zone were relatively simply defined with any light source in the lighting design potentially contributing to glare, FIGS. 16A and B illustrate a more complicated scenario in which the boundary conditions can produce non-glare zones, glare zones, and areas not evaluated for glare—all from the same light source. FIGS. 17-24 illustrate a further complication; in this example, the various colored lines do not depict a simple aiming axis centered on a light source that produces lighting in a generally symmetric pattern centered on the aiming axis (as in FIGS. 16A and B). Rather, the lines projecting outward from mounting position S3 in FIGS. 17-24 represent the cutoff angle of the associated fixture above the aiming angle of the fixture; an angle only relevant for more sophisticated lighting systems with the ability to vary beam cutoff independent of fixture aiming. This is why the three left-most radiating blue lines of the affected fixtures in FIG. 24 are shown as shifted (as compared to FIG. 21), even though the fixtures themselves were not re-aimed. So it can be seen that aspects according to the present invention are entirely adaptable to advances in glare science, as well as advances in lighting design tools and advances in lighting systems.

Regardless of whether re-aiming is manual or automatic, why a lighting designer may opt to define an onsite glare zone as outside of a glare line and dependent upon a fixture's beam angle may be the result of some insight gained into glare science; perhaps an acknowledgement that spectators in the middle of the court (e.g., athletes playing on the tennis court) rarely look anywhere except near the top of the net whereas spectators on the fringes of the court (e.g., line umpires) may have multiple lines of sight and a more complex relationship with glare perception. Of course, knowing all possible variables relating to glare science or every way in which onsite glare and offsite glare differ is not required to practice the invention. Though, as one's understanding of the aforementioned expands, the complexity of method 1000 and associated visualizations of glare may likewise expand; this is perhaps best illustrated in FIGS. 26-29.

FIGS. 26 and 27 illustrate a combination of a glare line for an onsite glare scenario (see, e.g., FIGS. 16A and B) and a colored overlay indicating severity of glare (see, e.g., FIGS. 5-7, 10). The result is a glare map of sorts—a color coded map indicating the severity of glare on site, wherein the glare thresholds have been defined in terms of horizontal footcandles at the plane of the target area (FIG. 26) or maximum candela from any source (i.e., 360° field of view) at all points on the grid defined within the lighting design software (FIG. 27); it is of note that grid spacing and lighting measurements taken at grid points are well understood concepts within the art of lighting design, and so no further discussion is provided. This glare map can be used to show an evolution of glare control in lighting products from a single manufacturer (as is illustrated in the top row of FIGS. 26 and 27) or demonstrate a difference in products (from a glare control perspective) between manufacturers (as is illustrated in the bottom rows of FIG. 26 or 27); though, it should be noted that the images and values reported in FIGS. 26 and 27 are merely intended to illustrate one possible way to visually represent glare perception, and are not intended to promote or disparage any particular approach to lighting design. Said glare maps could even have real-time evaluation component as is described in step 1004 of method 1000; this is illustrated in FIGS. 28 and 29.

FIGS. 28 and 29 illustrate a glare map for a virtual lighting system designed to illuminate an ice hockey rink (see, e.g., the green rounded rectangular shape in the center of FIGS. 28 and 29). In this example the rink is illuminated by four virtual light sources on what will be referred to as the southern side of the rink Like FIG. 27, a number of glare thresholds—blue for least offending, then yellow, orange, bright red, and then dark red for most offending (e.g., disability glare)—have been defined in terms of maximum luminous intensity (i.e., maximum candela). FIG. 28 illustrates the glare map as it would appear when comparing the maximum candela (as determined by the photometric data imputed into the software) against the thresholds—assuming a 360° field of view from each measurement point. However, as is well known to any athlete or spectator, in any sport there are perspectives or lines of sight much more common than others. As such, certain lines of sight could be identified and glare maps produced—in real time—for the same virtual lighting system, but from specified vantage points. FIG. 29, for example, illustrates the same virtual lighting design as FIG. 28 using the same glare thresholds, but instead of evaluating maximum candela within a 360° field of view at each grid point, only the maximum candela within a 180° field of view centered on (0,0,0) has been recorded, compared against the glare threshold, and color coded appropriately. This simulates an experience common to a spectator—a line of sight primarily directed towards center ice, and deviating 90° off axis in any direction; though, it should be noted that even a 180° field of view is somewhat impractical for an average spectator. As can be seen from FIG. 29, spectators seated on the south side of the rink will not likely perceive any glare (as defined by the glare threshold)—this is evidenced by the black gap in the glare map on the southern side of the rink. This makes practical sense because all four potential glare sources are located behind said spectators and the spectators are looking directly at center ice (0,0,0) and spanning 90° off axis in any direction.

The number of glare maps produced in real time, and their appearances, will of course vary depending on lines of sight, number of glare sources, location of glare sources, photometric data, number and value of glare thresholds, and so on. As previously stated, knowing all possible variables relating to glare science is not required to practice the invention. The present embodiment presents an opportunity to utilize aspects according to the present invention in a predictive mode so to enable the creation of actual lighting systems from virtual lighting designs that take into account perceived glare from athletes and spectators alike—even from those who may perceive offsite glare such as community members—so to, ultimately, promote the adequate lighting of a target area as viewed from one or more vantage points to one or more specifications for one or more situations, and in a manner that addresses glare perception.

D. Options and Alternatives

The invention may take many forms and embodiments. The foregoing examples are but a few of those. To give some sense of some options and alternatives, a few examples are given below.

Two possible modes of practicing aspects according to the present invention—retrofit and predictive—have been discussed. It is of note that neither mode is required to be practiced, or practiced first, to glean benefits from aspects according to the present invention. It is anticipated that application of method 1000 to existing or yet-to-be-developed lighting design tools, coupled with a basic understanding of glare science and aspects according to the present invention, may yield not only the ability to work with each spectator/user to quantify a subjective experience, but the ability to understand what is visually pleasing to a particular spectator/user—irrespective of any diagnostic or predictive approach to designing a virtual or actual lighting system. Further, there is benefit to be derived from simply comparing a lighting system—virtual or existing—before and after re-aiming, colored overlay, etc. according to aspects of the present invention. As an example of Embodiment 1, there is potential to save a slider 2004 setting for each user. In such an instance the default view (FIG. 5) could be set according to a user's natural tendencies. This could potentially save time and aid a user in verbalizing or otherwise putting to paper the aesthetic he/she expects in a lighting design; what he/she expects to get in an "after" condition. As an example of Embodiment 2, there is potential to recognize what truly represents "off site" versus "on site" for each sport, as determined from input by athletes, spectators, and the like. This permits a user to visualize what glare in a lighting system looks like and where it exists "before" and "after" defining boundaries for "on site"—potentially identifying fixtures which might pose a problem in the future, even if there is no immediate plan to retrofit. This before-versus-after implementation of aspects according to the present invention lends itself to yet another mode of operation: verification. In verification mode, glare sources for an existing lighting system could be identified, their luminance/luminous intensity measured, and the relevant glare metrics calculated not to retrofit the system, but to verify that the existing system represents what was warranted or modeled.

It is anticipated that method 1000 could be modified in accordance with advances in glare science, lighting design tools, lighting systems, or simply refinement of tastes in lighting design. For example, for several years there has been a push to create more energy-efficient lighting systems. There has also been a push to understand the "health" of everything from homes to offices: understand how energy usage changes over time, monitor individual electrical loads (e.g., microwaves, refrigerators, cooling units) to understand how they impact utility costs, connect wirelessly to change settings when an occupant is gone, and the like. Method 1000 could be expanded to include an optional step of considering environmental impact of spill light (e.g., on behavior patterns of nocturnal creatures), utility costs associated with running an existing lighting system that has been identified in retrofit mode as creating glare versus a replacement system that does not produce glare, or the anticipated cost to add fixtures to a virtual lighting design based on a change to glare threshold levels, for example. In essence, improving upon "turnkey" lighting designs when operating in predictive mode, improving an understanding of glare perception when operating in retrofit mode, or generally improving the process by which a target area is adequately illuminated as viewed from one or more vantage points to one or more specifications for one or more situations are not limitations of aspects according to the present invention.

Lastly, specific lighting design tools have been discussed, and in the context of how they could be modified according to aspects of the present invention. A variety of apparatuses and means (e.g., cameras, light meters, range finders, software programs) associated with lighting design, unrelated to lighting design, or not yet developed may be suitable for use according to aspects of the present invention. Likewise, though thresholds have been defined primarily in terms of luminous intensity (cd) and luminance ($cd/m^2$) and discussed in the context of providing boundaries for method 1000, some other kind of threshold (e.g., percent deviation from a defined minimum acceptable horizontal illuminance for a specified activity) or additional threshold conditions may be suitable for consideration according to aspects of the present invention.

What is claimed is:

1. A method of visualizing glare in an existing lighting system based on user perception comprising:
  a. producing a digital image of at least a portion of the lighting system at a selectable dynamic range with a photographic imaging device having variable aperture and shutter speed settings and adapted to measure luminance;
  b. defining one or more glare thresholds based, at least in part, on the selected dynamic range, said glare thresholds indicating severity of perceived glare and wherein at least one of said one or more glare thresholds indicates discomfort glare;
  c. assigning one or more colors or other indicia to different portions of the dynamic range in accordance with the one or more glare thresholds;
  d. displaying the digital image on a display;
  e. modifying the pixels of the digital image to produce an overlay such that:
    i. corresponding pixels of measured luminances below the selected dynamic range are colored or otherwise visually indicated as separate from the lighting system;
    ii. corresponding pixels of measured luminances above the selected dynamic range are colored or otherwise visually indicated as exceeding the most severe glare threshold; and
    iii. corresponding pixels of measured luminances within the selected dynamic range are colored or otherwise visually indicated in accordance with the one or more glare thresholds; and
  f. modifying the portion of the overlay corresponding to luminances within the selected dynamic ranges based on user evaluation.

2. The method of claim 1 where the image is a high dynamic range image composited from a plurality of images taken at the same position but of different dynamic ranges.

3. The method of claim 1 wherein the image is produced from the vantage point of a typical line of sight of the user.

4. The method of claim 1 wherein the image is produced from the vantage point of a worst case scenario line of sight of the user.

5. The method of claim 1 wherein the modifying the portion of the overlay corresponding to luminances within the selected dynamic ranges based on user evaluation comprises changing the glare threshold values so to cause a commensurate change in the colors or indicia of said portion of the overlay.

6. The method of claim 1 wherein the one or more glare thresholds further comprises a second threshold indicating disability glare.

7. The method of claim 2 further comprising:
  a. producing a reference image at a known distance from the position at which the high dynamic image was composited;

b. calculating the distance to the lighting system;
c. deriving luminous intensity from the distance to the lighting system and the luminance measurements; and
d. refining the glare thresholds based on the derived luminous intensity.

8. A method of visualizing glare in a virtual lighting system based on user perception comprising:
a. generating an image of at least a portion of the virtual lighting system and a virtual target area with a software-based lighting design program adapted for input and including display of:
   i. at least one boundary condition of the virtual target area;
   ii. at least one pole location;
   iii. aiming of at least one virtual lighting fixture; and
   iv. photometric data of said virtual lighting fixture;
b. defining one or more glare thresholds based, at least in part, on (i) the boundary conditions of the virtual target area and (ii) illumination-related values;
c. assigning one or more colors or other indicia to different portions of the generated image in accordance with the one or more glare thresholds;
d. displaying the generated image on a display;
e. modifying the generated image to produce a visual indication of the one or more glare thresholds or violation or the one or more glare thresholds; and
f. modifying the virtual lighting system or glare thresholds based on user evaluation.

9. The method of claim 8 wherein the one or more glare thresholds indicate severity of glare.

10. The method of claim 8 wherein the one or more glare thresholds indicate presence of onsite or offsite glare.

11. The method of claim 8 wherein the step of modifying the virtual lighting system based on user evaluation comprises re-aiming the virtual lighting fixtures.

12. The method of claim 11 wherein the re-aiming of virtual lighting fixtures is a function of the software-based lighting design program and based, at least in part, on the photometric data and pole locations.

13. The method of claim 8 wherein the modifying the generated image to produce a visual indication of the one or more glare thresholds comprises modifying the generated image to produce a colored overlay comprising one or more colors, each color corresponding to a range of values.

14. The method of claim 13 wherein the range of values for each color of the colored overlay is determined, at least in part, by a comparison of the photometric data to the one or more glare thresholds.

15. A system for visualizing glare relative to illuminating an actual target area with a lighting system comprising a plurality of light sources comprising:
a. a digital processor;
b. a digital display operatively connected to the digital processor;
c. a source for digital data for generating in the digital processor a digital target area representative of:
   i. the actual target area; and
   ii. illumination of the actual target area;
   iii. the digital target area representation including digital data from which an estimated illumination-related value from at least one vantage point can be derived for the digital target area representation;
d. software associated with the digital processor configured to:
   i. compare at least one selected estimated illumination-related value of said digital data to at least one threshold value correlated to potential glare wherein the at least one threshold value includes a threshold correlated to discomfort glare;
   ii. generate on the digital display:
      1. the digital target area representation; and
      2. a visual representation of glare for any portion of the digital target area representation where the selected estimated illumination-related value exceeds the threshold value.

16. The system of claim 15 wherein the source comprises: (a) a lighting design program and the digital target area representation comprises a software-based lighting design program layout for location, aiming direction, and light output and distribution of each of the light sources of the lighting system relative the actual target area with photometric calculations comprising the digital data from which estimated illumination-related values are obtained, or (b) a digital camera and the digital target area representation comprises a digital image of at least some of the actual target area with each pixel of the digital image comprising the digital data from which estimated illumination-related values are obtained, the digital camera configured to: (a) create at least one of live video, a single still image, plural still images, and plural still images blended into a single image; and (b) movable in a controlled manner relative to a base or the target area.

17. The system of claim 16 wherein the visual representation of glare comprises a graphic indication.

18. The system of claim 17 wherein the graphic indication comprises a boundary lines indexed to a type of glare.

19. The system of claim 15 wherein:
a. the at least one threshold value comprises first and second threshold values;
b. the first threshold value higher than the second threshold value; and
c. wherein the first and second threshold values correspond to disability glare and said discomfort glare respectively.

20. The system of claim 19 further comprising a third threshold value lower than the second threshold luminance value and wherein the third threshold value corresponds with another type of glare.

21. A product installed and operated at the target area made by the process of claim 1.

22. A product installed and operated at the target area made by the process of claim 8.

* * * * *